(12) United States Patent
Kutsukake

(10) Patent No.: US 11,937,432 B2
(45) Date of Patent: Mar. 19, 2024

(54) SEMICONDUCTOR DEVICE WITH REGIONS AND CONTACTS

(71) Applicant: Kioxia Corporation, Tokyo (JP)

(72) Inventor: Hiroyuki Kutsukake, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 308 days.

(21) Appl. No.: 17/459,844

(22) Filed: Aug. 27, 2021

(65) Prior Publication Data

US 2022/0285377 A1    Sep. 8, 2022

(30) Foreign Application Priority Data

Mar. 8, 2021 (JP) ................................. 2021-035988

(51) Int. Cl.
*H10B 43/40* (2023.01)
*H10B 43/27* (2023.01)
*H01L 29/786* (2006.01)

(52) U.S. Cl.
CPC ............. *H10B 43/40* (2023.02); *H10B 43/27* (2023.02); *H01L 29/786* (2013.01); *H01L 29/78651* (2013.01)

(58) Field of Classification Search
CPC ... H10B 43/27; H10B 43/40; H01L 29/78651; H01L 29/78654; H01L 29/7866; H01L 29/78663; H01L 29/78666; H01L 29/78672; H01L 29/78675
See application file for complete search history.

(56) References Cited

U.S. PATENT DOCUMENTS

| | | | |
|---|---|---|---|
| 6,088,260 | A | 7/2000 | Choi |
| 6,118,152 | A | 9/2000 | Yamaguchi et al. |
| 2005/0269642 | A1 | 12/2005 | Minami |
| 2012/0236619 | A1 | 9/2012 | Kutsukake et al. |
| 2020/0066909 | A1* | 2/2020 | Yanagisawa ...... H01L 29/66772 |
| 2020/0105313 | A1 | 4/2020 | Huang et al. |
| 2020/0204175 | A1* | 6/2020 | Liang ................ H01L 21/76895 |

FOREIGN PATENT DOCUMENTS

| | | |
|---|---|---|
| JP | 2012-199292 A | 10/2012 |
| TW | 202029193 A | 8/2020 |

* cited by examiner

*Primary Examiner* — Robert G Bachner
*Assistant Examiner* — Molly K Reida
(74) *Attorney, Agent, or Firm* — Foley & Lardner LLP

(57) ABSTRACT

Embodiments provide a semiconductor device capable of being highly integrated.
A semiconductor device includes a semiconductor substrate, a first insulating layer formed toward an inside of a semiconductor substrate from a main surface of the semiconductor substrate, and a transistor formed on the first insulating layer. the transistor has a first semiconductor layer formed on the first insulating layer to be insulated from the semiconductor substrate, a second insulating layer provided on a second region among of a first region, the second region, and a third region sequentially arranged in a first direction along the main surface of the first semiconductor layer, and a first conductive layer provided on the second insulating layer. a first contact is connected to the first region of the first semiconductor layer, a second contact is connected to the third region of the first semiconductor layer, and a third contact is connected to the first conductive layer.

10 Claims, 18 Drawing Sheets

SEMICONDUCTOR DEVICE WITH REGIONS AND CONTACTS

CROSS-REFERENCE TO RELATED APPLICATION

This application is based upon and claims the benefit of priority from Japanese Patent Application No. 2021-035988, filed Mar. 8, 2021, the entire contents of which are incorporated herein by reference.

FIELD

Embodiments described herein relate to a semiconductor device.

BACKGROUND

Examples of related art include a semiconductor substrate and a semiconductor device including a plurality of transistors formed on the semiconductor substrate.

DETAILED DESCRIPTION

Figure 1:
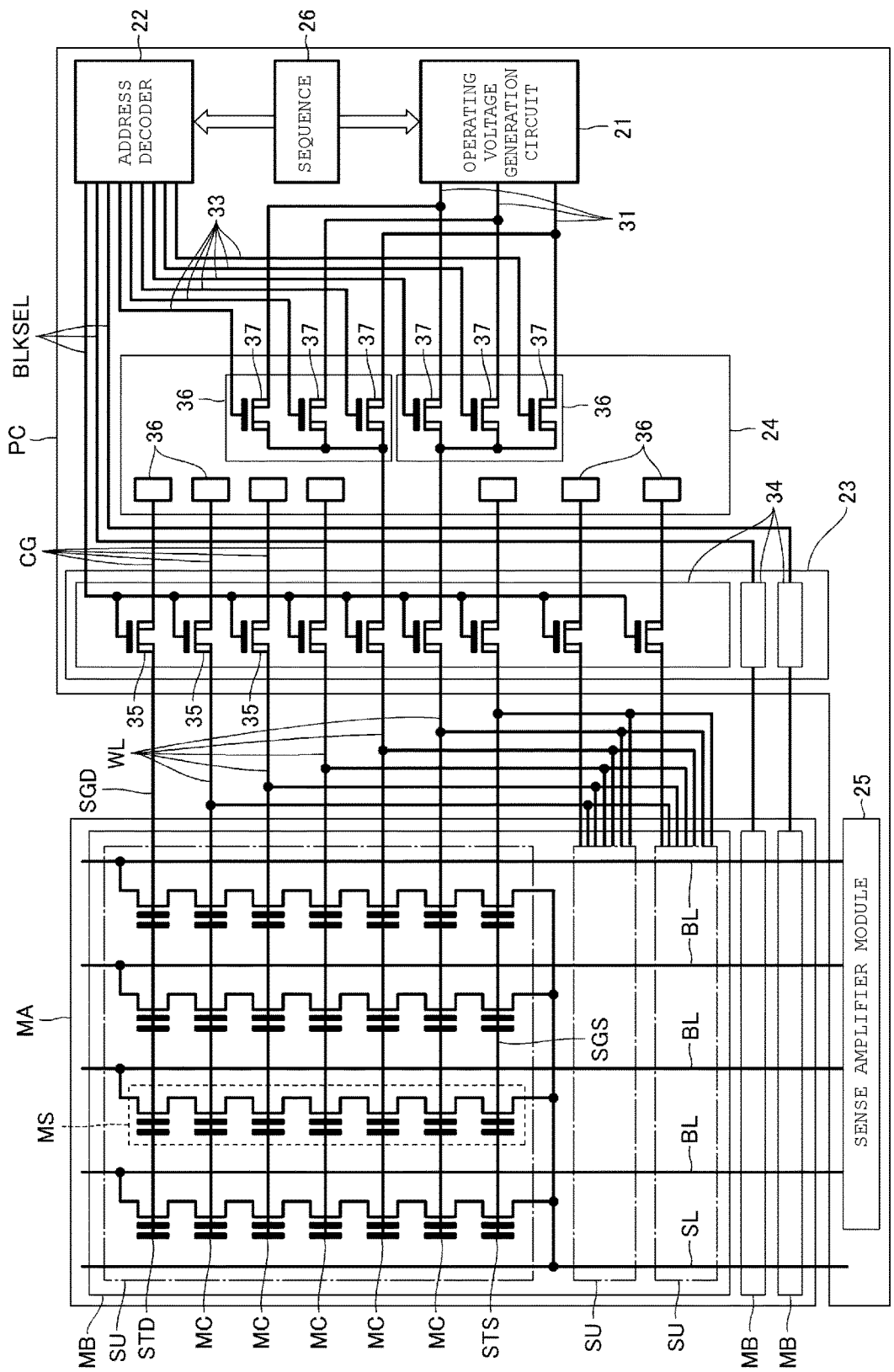
FIG. 1 is an equivalent circuit diagram illustrating a schematic configuration of a semiconductor device according to a first embodiment.

Embodiments provide a semiconductor device capable of being highly integrated.

In general, according to at least one embodiment, a semiconductor device includes a semiconductor substrate, a first insulating layer formed toward an inside of a semiconductor substrate from a main surface of the semiconductor substrate, and a transistor formed on the first insulating layer, the transistor has a first semiconductor layer including a first region, a second region, and a third region which are formed on the first insulating layer to be insulated from the semiconductor substrate and sequentially arranged in a first direction along the main surface of the semiconductor substrate, a second insulating layer provided on the second region of the first semiconductor layer and a first conductive layer provided on the second insulating layer. A first contact is connected to the first region of the first semiconductor layer, a second contact is connected to the third region of the first semiconductor layer, and a third contact is connected to the first conductive layer.

Next, a semiconductor device according to at least one embodiment will be described in detail with reference to the drawings. Following embodiments are merely examples and are not intended to limit the present disclosure. Further, following drawings are schematic, and some configurations and the like are omitted for the sake of convenience of the description. Further, the same reference numerals can be allocated to portions common to a plurality of embodiments, and descriptions thereof may be omitted.

Further, in the present specification, a predetermined direction parallel to a main surface of a substrate is referred to as an X direction, a direction parallel to a front surface of the substrate and perpendicular to the X direction is referred to as a Y direction, and a direction perpendicular to the front surface of the substrate is referred to as a Z direction. Further, in the present specification, terms such as "upper" and "lower" are based on the substrate. For example, a direction away from the substrate in the Z direction is referred to as upper, and a direction closer to the substrate in the Z direction is referred to as lower. Further, when referring to a lower surface or a lower end of a certain configuration, this is assumed to indicate a surface or an end portion on a substrate side of the configuration, and when referring to an upper surface or an upper end, this is assumed to indicate a surface or an end portion opposite to the substrate of the configuration.

Further, in the present specification, a "semiconductor device" has various types of meanings such as a configuration including a host computer such as a memory system including a control die such as a memory die, a memory chip, a memory card, or a solid state drive (SSD), a smart phone, a tablet terminal, or a personal computer, a configuration such as sensor or an arithmetic unit that do not have a main purpose of storing data, and the like.

Further, in the present specification, a term "electrical connection" of a first configuration and a second configuration refers to that the first configuration is directly connected to the second configuration or via a circuit such as an interconnection, a semiconductor member, or a transistor. For example, when three transistors are connected in series, a first transistor is "electrically connected" to a third transistor, even when a second transistor is in an OFF state.

First Embodiment

Configuration

Hereinafter, a configuration of a semiconductor device according to a first embodiment will be described with reference to the drawings.

FIG. 1 is a schematic equivalent circuit diagram illustrating a configuration of the semiconductor device according to the first embodiment applied to a semiconductor storage device.

The semiconductor device according to the present embodiment includes a memory cell array MA and a peripheral circuit PC as a control circuit for controlling the memory cell array MA.

The memory cell array MA includes a plurality of memory block MBs. Each of the plurality of memory block MBs includes a plurality of string units SU. Each of the plurality of string unit SU includes a plurality of memory strings MS. One end of each of the plurality of memory strings MS is connected to the peripheral circuit PC via a bit line BL. Further, the other ends of the plurality of memory strings MS are each connected to the peripheral circuit PC via a common source line SL.

The memory string MS includes a drain select transistor STD, a plurality of memory cells MC, and a source select transistor STS which are connected in series between the bit line BL and the source line SL. Hereinafter, the drain select transistor STD and the source select transistor STS may be simply referred to as select transistors STD and STS and the like.

Each of the memory cells MC is a field effect transistor (memory transistor) including a semiconductor layer that functions as a channel region, a gate insulating film including a charge storage film, and a gate electrode. A threshold voltage of the memory cell MC changes according to the amount of electric charges in a charge storage film. Word lines WL are connected to the gate electrodes, respectively, of the plurality of memory cell MCs corresponding to one memory string MS. The word line WLs are commonly connected to all memory strings MS in one memory block MB.

The select transistors STD and STS are each a field effect transistor including a semiconductor layer that functions as a channel region, a gate insulating film, and a gate electrode. Select gate lines SGD and SGS are connected to the gate electrodes of the select transistors STD and STS, respectively. The drain select gate line SGD is provided corresponding to the string unit SU and is connected in common to all the memory strings MS in one string unit SU. The source select gate line SGS is commonly connected to all the memory strings MS in the plurality of string units SU in one memory block MB.

The peripheral circuit PC includes an operating voltage generation circuit 21 that generates operating voltages, an address decoder 22 that decodes address data, a block selection circuit 23 and a voltage selection circuit 24 that transmit the operating voltages to the memory cell array MA according to output signals of the address decoder 22, a sense amplifier module 25 connected to the bit lines BL, and a sequencer 26 that controls these.

The operating voltage generation circuit 21 includes a plurality of operating voltage output terminals 31. The operating voltage generation circuit 21 includes, for example, a step-down circuit such as a regulator and a step-up circuit such as a charge pump circuit. The operating voltage generation circuit 21 sequentially generates a plurality of operating voltages which are applied to the bit lines BL, the source line SL, the word lines WL, and the select gate lines SGD and SGS during a read operation, a write operation, and an erasing operation for the memory cell array MA according to a control signal from the sequencer 26, and outputs the operating voltages to the plurality of operating voltage output terminals 31. The operating voltages outputted from the operating voltage output terminals 31 are appropriately adjusted according to the control signal from the sequencer 26.

The address decoder 22 includes a plurality of block selection lines BLKSEL and a plurality of voltage selection lines 33. For example, the address decoder 22 decodes address data sequentially with reference to the address data of an address register according to the control signal from the sequencer 26, turns on a block drive transistor 35 and a voltage select transistor 37 corresponding to the address data, and turns off the rest of the block drive transistors 35 and the voltage select transistors 37. For example, a voltage of the block selection line BLKSEL and the voltage selection line 33 corresponding to the address data is set to an "H" state, and the rest of voltages are set to an "L" state. When a P-channel type transistor is used instead of an N-channel type transistor, a reverse voltage is applied to the interconnections.

In the illustrated examples, the address decoder 22 is provided with one block selection line BLKSEL for each memory block MB. This configuration may be changed as appropriate. For example, one block selection line BLKSEL may be provided for two or more memory block MBs.

The block selection circuit 23 includes a plurality of block selection units 34 corresponding to the memory blocks MB. Each of the plurality of block selection units 34 includes a plurality of block drive transistors 35 corresponding to the word lines WL and the select gate lines SGD and SGS. The block drive transistors 35 are each, for example, a field effect withstand voltage transistor. A drain electrode of each of the block drive transistors 35 is electrically connected to the corresponding word line WL or select gate lines SGD and SGS. Source electrodes thereof are each electrically connected to the operating voltage output terminal 31 via an interconnection CG and the voltage selection circuit 24. A gate electrode thereof is commonly connected to the corresponding block selection line BLKSEL.

The block selection circuit 23 further includes a plurality of transistors (not illustrated). The plurality of transistors are field effect withstand voltage transistors connected between the select gate lines SGD and SGS and a ground voltage supply terminal. The plurality of transistors connect the select gate lines SGD and SGS in the non-selected memory blocks MB to the ground voltage supply terminal. The plurality of word lines WL in the non-selected memory blocks MB are in a floating state.

The voltage selection circuit 24 includes a plurality of voltage selection units 36 corresponding to the word lines WL and the select gate lines SGD and SGS. Each of the plurality of voltage selection units 36 includes a plurality of voltage select transistors 37. The voltage select transistors 37 are, for example, field effect withstand voltage transistors. A drain terminal of each of the voltage select transistors 37 is electrically connected to the corresponding word line WL or the corresponding select gate lines SGD and SGS via the interconnection CG and the block selection circuit 23. Each source terminal thereof is electrically connected to the corresponding operating voltage output terminal 31. Each gate electrode thereof is connected to the corresponding voltage selection line 33.

The sense amplifier module 25 is connected to the plurality of bit lines BL. The sense amplifier module 25 includes, for example, a plurality of sense amplifier units corresponding to the bit lines BL. Each of the sense amplifier units includes a clamp transistor that charges the bit line BL based on a voltage generated by the operating voltage generation circuit 21, a sense transistor that senses a voltage or a current of the bit line BL, and a plurality of latch circuits for storing an output signal of the sense transistor, write data, and the like.

The sequencer 26 outputs a control signal to the operating voltage generation circuit 21, the address decoder 22, and the sense amplifier module 25 according to an inputted instruction and a state of the semiconductor device. For example, the sequencer 26 decodes command data by sequentially with reference to the command data of a command register according to a clock signal, and outputs the decoded command data to the operating voltage generation circuit 21, the address decoder 22, and the sense amplifier module 25.

Figure 2:
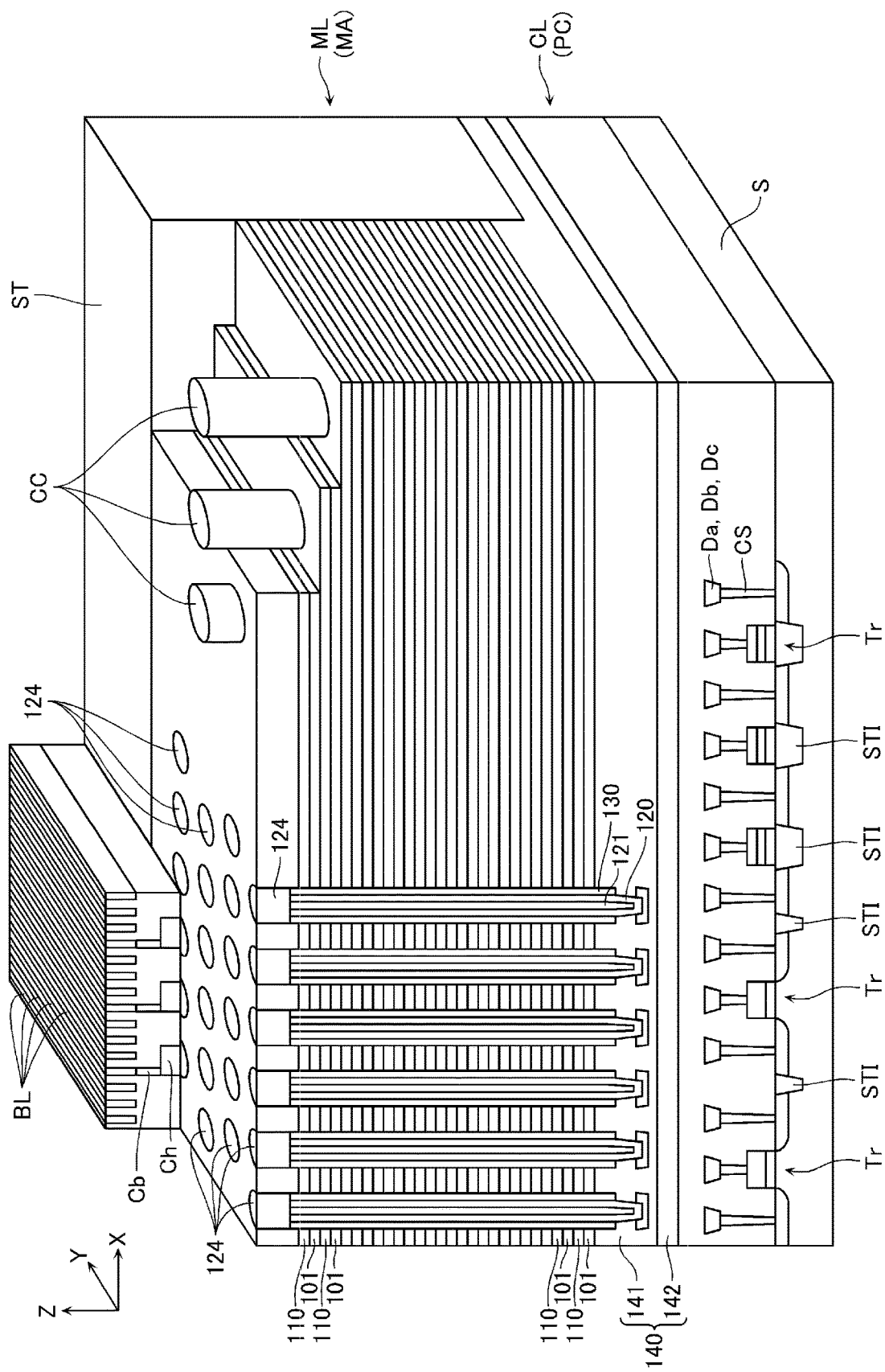
FIG. 2 is a schematic perspective view of the semiconductor device.

FIG. 2 is a schematic perspective view of the semiconductor device according to the at least one embodiment. FIG. 2 illustrate a schematic structure, but does not illustrate a detailed arrangement and the like of each configuration. More specific arrangement and the like of each configuration will be described below with reference to FIGS. 4 to 6.

As illustrated in FIG. 2, the semiconductor device according to at least one embodiment includes a semiconductor substrate S, a circuit layer CL provided on the semiconductor substrate S, and a memory layer ML provided over the circuit layer CL.

The semiconductor substrate S is, for example, a semiconductor substrate made of single crystal silicon (Si) and the like. The semiconductor substrate S has, for example, a double-well structure including an N-type well on a front surface of the P-type semiconductor substrate and further including a P-type well in the N-type well. Further, the semiconductor substrate S is provided with an insulating layer STI such as silicon oxide (SiO$_2$).

The circuit layer CL includes a plurality of transistors Tr configuring the peripheral circuit PC (FIG. 1), and a plurality of interconnections Da, Db, and Dc and contacts CS connected to the plurality of transistors Tr. Some of the transistors Tr are, for example, field effect transistors that use the front surface of the semiconductor substrate S as a channel region (gate region). A region of the front surface of the semiconductor substrate S that functions as a part of the transistor Tr is surrounded by the insulating layer STI. The others of the transistors Tr are, for example, field effect transistors that use the front surface of the semiconductor layer formed on the insulating layer STI as a channel region (gate region). This structure will be described in detail below.

The memory layer ML includes a plurality of configurations in the memory cell array MA. The memory layer ML includes a plurality of conductive layers 110 arranged in the Z direction, semiconductor pillars 120 extending in the Z direction and facing the plurality of conductive layers 110, gate insulating films 130 provided between the plurality of conductive layers 110 and the semiconductor pillars 120, and a conductive layer 140 connected to a lower end of the semiconductor pillars 120.

A plurality of the conductive layers 110 are each a substantially plate-shaped conductive layer extending in the X direction and are arranged in the Z direction. The conductive layers 110 may each include, for example, a stack film and the like of titanium nitride (TiN) and tungsten (W) or may include polycrystalline silicon and the like including impurities such as phosphorus or boron. Further, an insulating layer 101 such as silicon oxide (SiO$_2$) is provided between the conductive layers 110.

Among the plurality of conductive layers 110, one or a plurality of conductive layer 110 located at the lowest layer function as the source select gate line SGS (FIG. 1) and gate electrodes of the plurality of source select transistors STS (FIG. 1) connected thereto. Further, the plurality of conductive layers 110 located over these function as the word lines WL (FIG. 1) and gate electrodes of the plurality of memory cells MC (FIG. 1) connected thereto. Further, one or more conductive layers 110 located over these function as the drain select gate line SGD (FIG. 1) and gate electrodes of the plurality of drain select transistors STD (FIG. 1) connected thereto.

The semiconductor pillars 120 are arranged in the X direction and the Y direction. Each of the semiconductor pillars 120 is, for example, a semiconductor layer such as undoped polycrystalline silicon (Si). Each of the semiconductor pillars 120 has a substantially cylindrical shape and includes an insulating layer 121 such as silicon oxide at a central portion thereof. Further, outer circumferential surfaces of the semiconductor pillars 120 are surrounded by the conductive layers 110. Lower end portions of the semiconductor pillar 120 are connected to the conductive layer 140. Upper end portions of the semiconductor pillars 120 are connected to bit lines BL extending in the Y direction via a semiconductor layer 124 including N-type impurity such as phosphorus (P), and contacts Ch and Cb. The semiconductor pillars 120 function as channel regions of the plurality of memory cells MC and the select transistors STD and STS in one memory string MS (FIG. 1).

Figure 3:
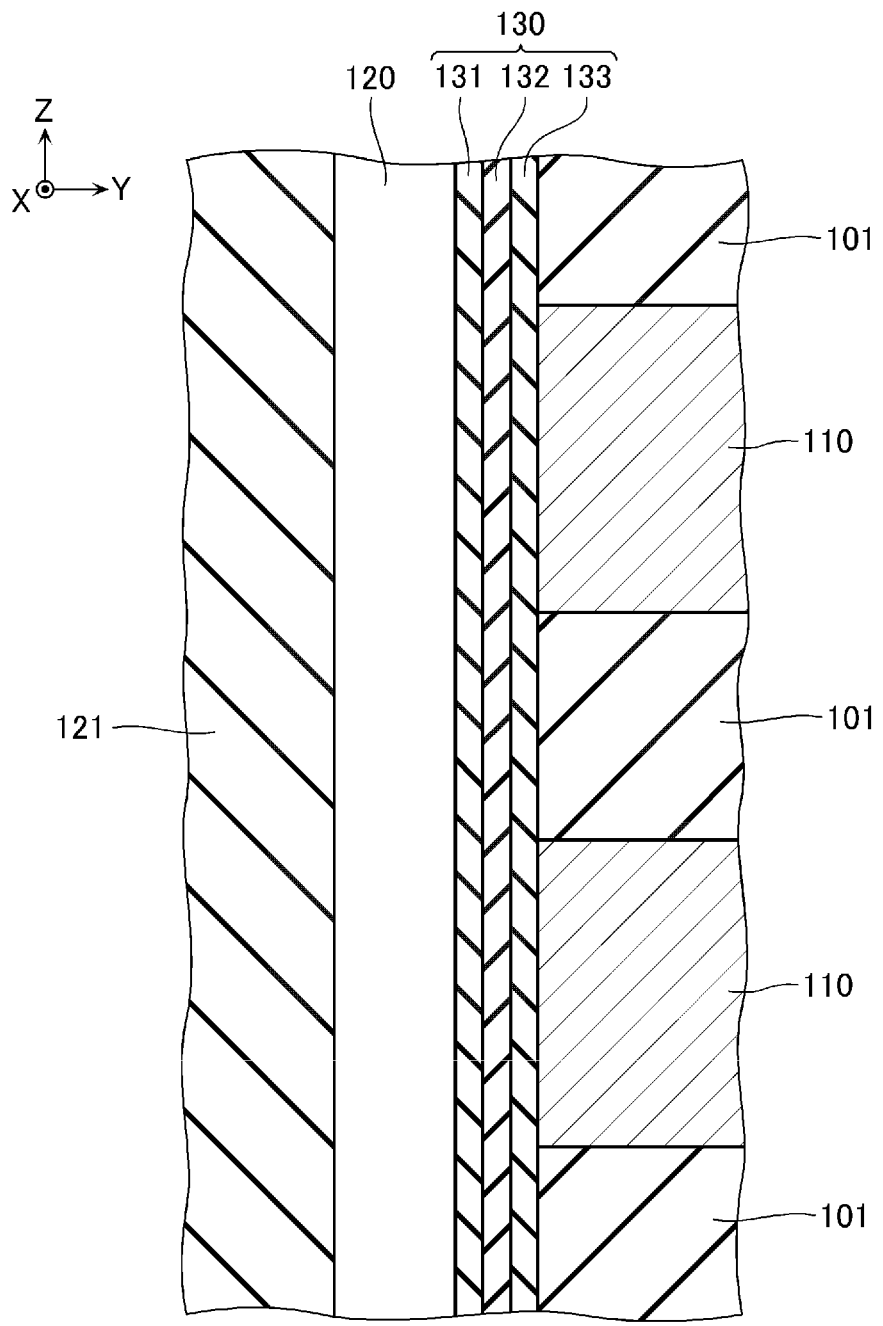
FIG. 3 is a schematic enlarged view of FIG. 2.

As illustrated in FIG. 3, for example, the gate insulating film 130 includes a tunnel insulating film 131, a charge storage film 132, and a block insulating film 133 stacked between the semiconductor pillar 120 and the conductive layers 110. The tunnel insulating film 131 and the block insulating film 133 are, for example, insulating films such as silicon oxide. The charge storage film 132 is, for example, a film capable of storing electric charges such as silicon nitride (SiN). The tunnel insulating film 131, the charge storage film 132, and the block insulating film 133 have a substantially cylindrical shape and extend in the Z direction along an outer circumferential surface of the semiconductor pillar 120.

Although FIG. 3 illustrates an example in which that the gate insulating film 130 includes the charge storage film 132 such as silicon nitride, the gate insulating film 130 may include, for example, a floating gate such as polycrystalline silicon and the like including N type or P type impurity.

As illustrated in FIG. 2, for example, the conductive layer 140 includes the conductive film 141 connected to the lower end portions of the semiconductor pillars 120 and the conductive film 142 provided on a lower surface of the conductive film 141. The conductive film 141 includes, for example, a conductive semiconductor such as polysilicon including N-type impurity such as phosphorus (P). The conductive film 142 may include a conductive semiconductor such as polysilicon including N-type impurity such as phosphorus (P) or may include a metal such as tungsten (W) or may include silicide and the like.

Next, the semiconductor device according to at least one embodiment will be described in more detail with reference to FIGS. 4 to 7. FIGS. 4 to 7 illustrate a schematic configuration, and the specific configuration may be changed as appropriate. Further, some configurations are omitted in FIGS. 4 to 7 for the sake of convenient description.

Memory Layer ML

Figure 4:
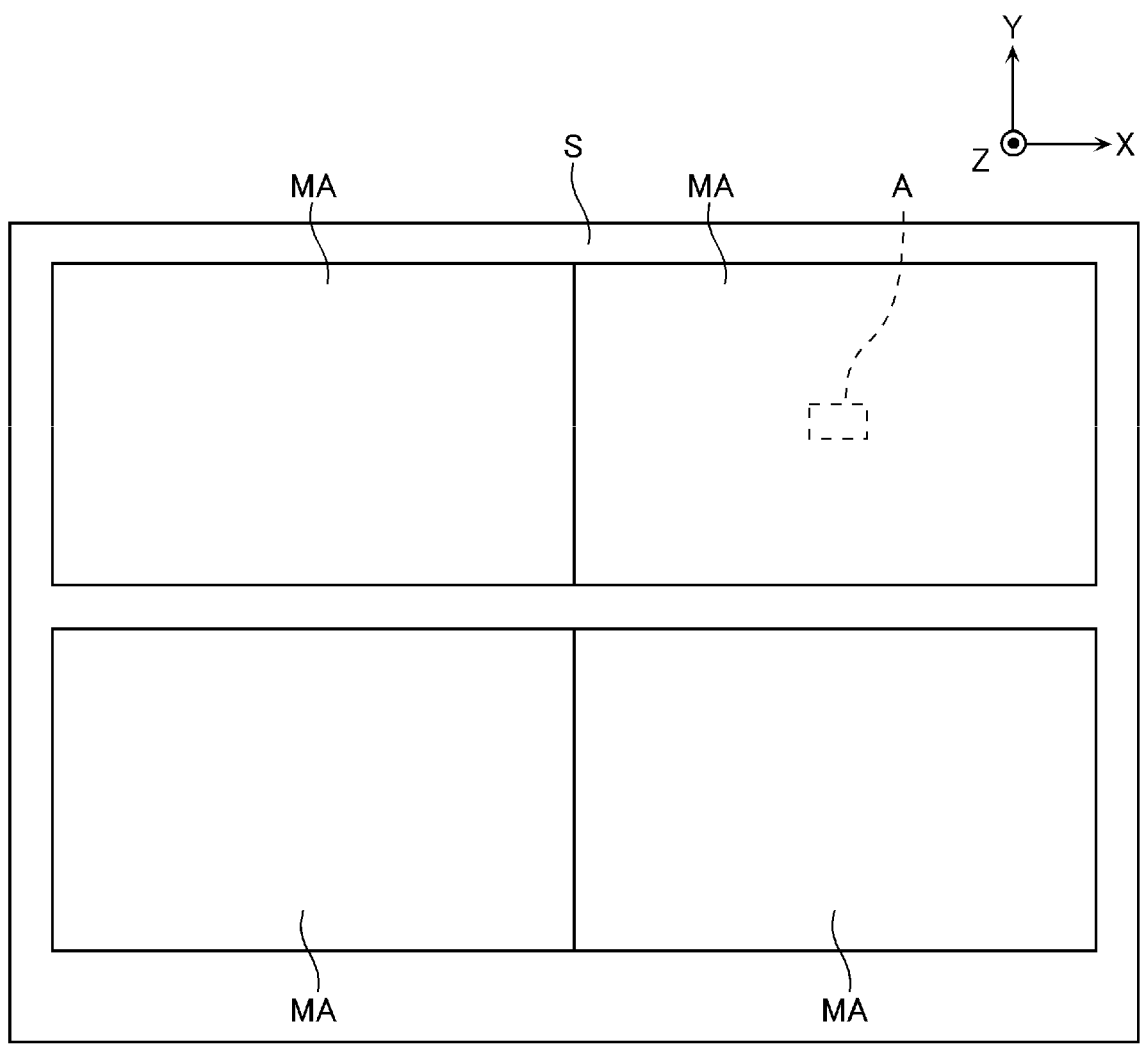
FIG. 4 is a schematic plan view of the semiconductor device.

FIG. 4 is a schematic plan view of the semiconductor device according to at least one embodiment. In an example of FIG. 4, the semiconductor substrate S is provided with four memory cell arrays MA arranged in the X direction and the Y direction.

Figure 5:
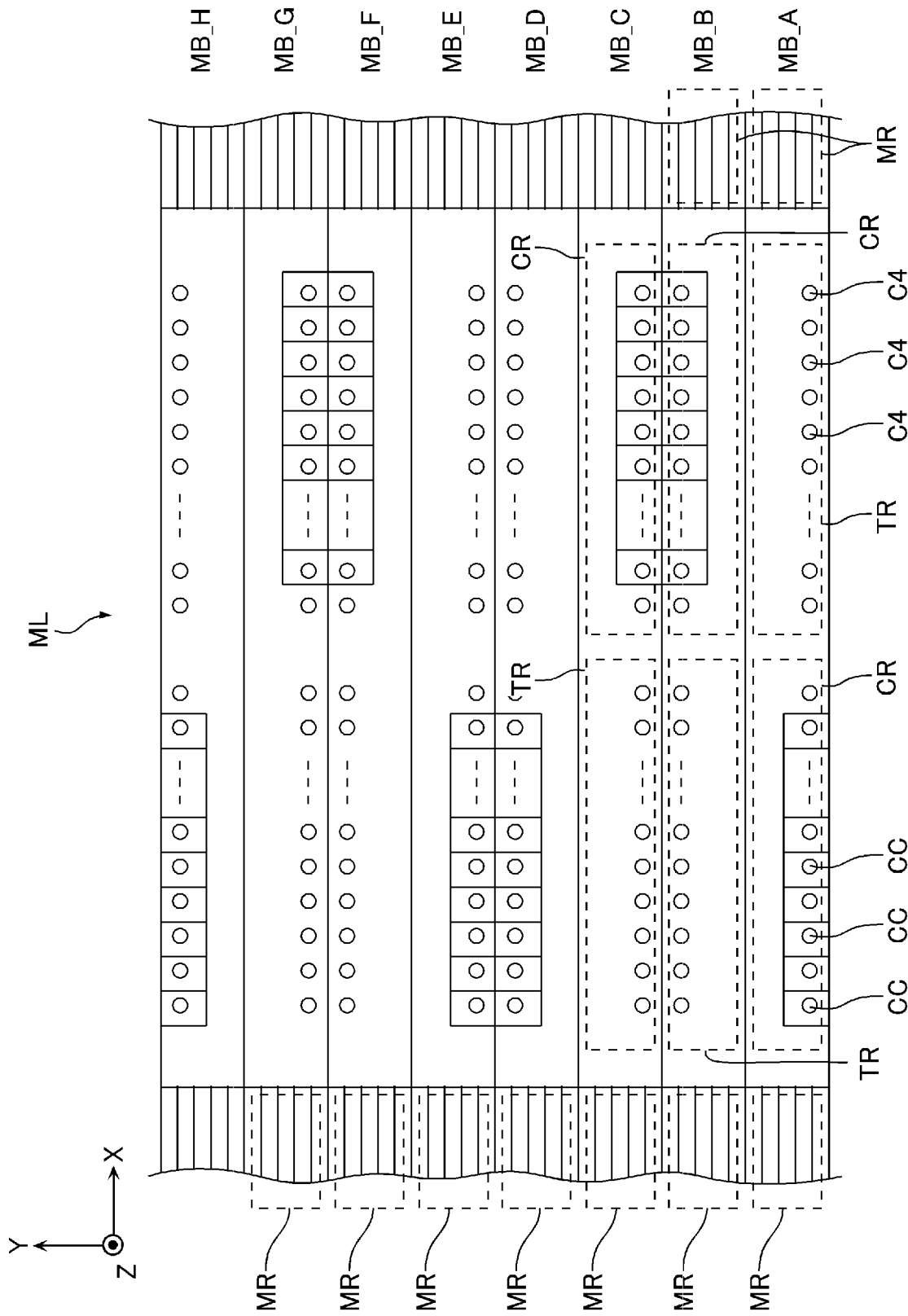
FIG. 5 is a schematic enlarged view of FIG. 4.

FIG. 5 is a schematic plan view illustrating a configuration of a region denoted by A in FIG. 4, and illustrates a configuration of the memory layer ML. As illustrated in FIG. 5, each memory cell array MA include a plurality of memory blocks MB (MB_A to MB_H) arranged in the Y direction. Further, each memory block MB includes two memory regions MR extending in the X direction and arranged in the X direction, a contact region CR provided between the two memory regions MR, and a penetration contact region TR provided between the contact region CR and the memory region MR.

In the example of FIG. 5, the contact region CR and the penetration contact region TR are arranged in a zigzag pattern. That is, in the memory blocks MB_A, MB_D, MB_E, and MB_H, the penetration contact region TR is arranged in a region on one side (for example, the right side in FIG. 5) in the X direction, and the contact region CR is arranged in a region on the other side (for example, the left side in FIG. 5) in the X direction. Meanwhile, in the memory blocks MB_B, MB_C, MB_F, and MB_G, the contact region CR is arranged in a region on one side (for example, the right side in FIG. 5) in the X direction, and the penetration contact region TR is arranged in a region on the other side (for example, the left side in FIG. 5) in the X direction. Further, the contact region CR provided in each memory block MB is adjacent to one contact region CR and one penetration contact region TR in the Y direction. Likewise, the penetration contact region TR provided in each memory block MB is adjacent to one contact region CR and one penetration contact region TR in the Y direction.

Figure 6:
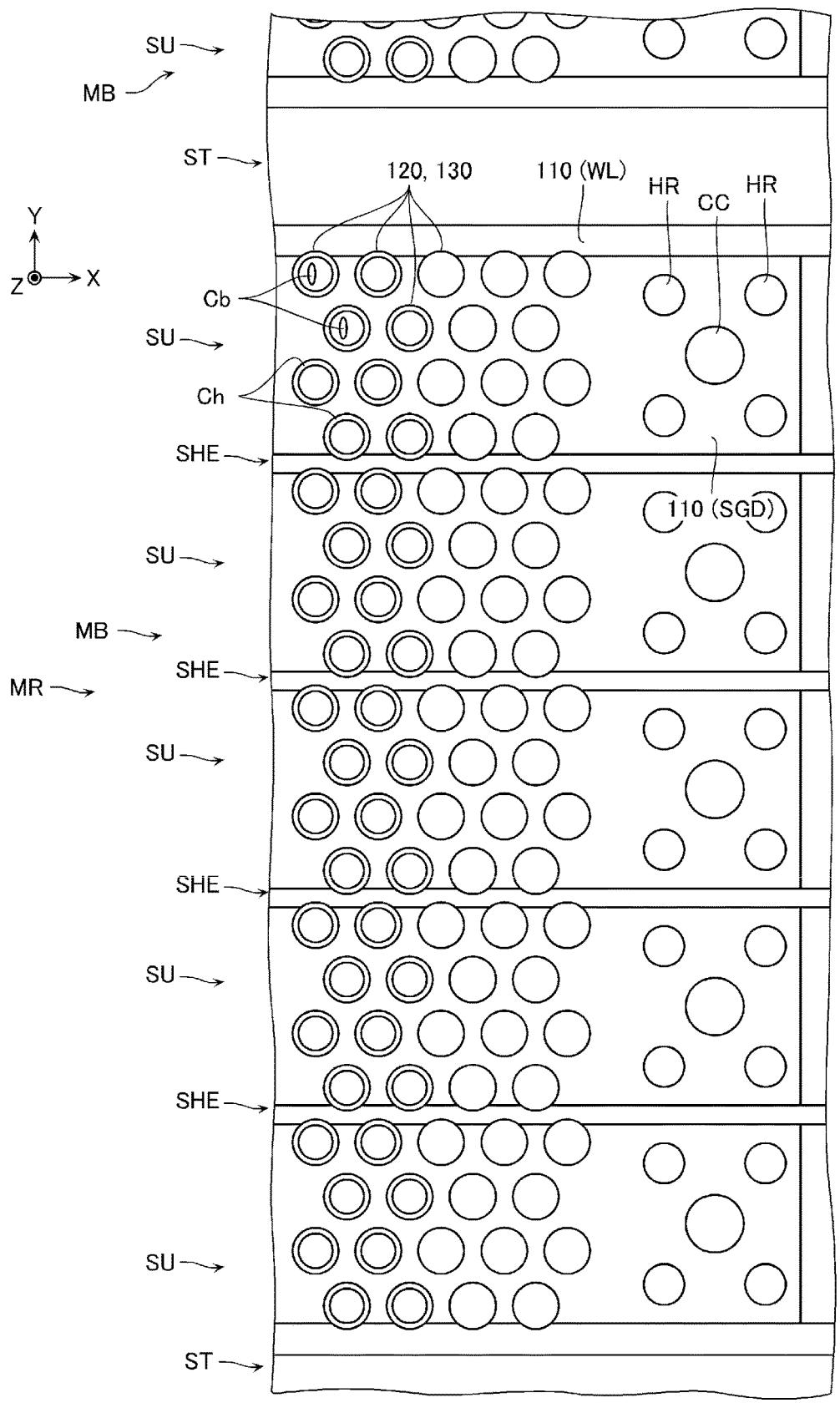
FIG. 6 is a schematic enlarged view of FIG. 5.

FIG. 6 is an enlarged view of a part of FIG. 5 and is a schematic plan view illustrating a configuration of the memory region MR. In an example of FIG. 6, the memory region MR of each memory block MB includes five string units SU arranged in the Y direction. In each string unit SU, the plurality of semiconductor pillars 120 and the plurality of gate insulating films 130 are provided in the X direction and the Y direction. Further, an inter-string-unit insulating layer SHE is provided between the two string units SU arranged in the Y direction. Some of the plurality of conductive layers 110 which function as the drain select gate lines SGD are separated in the Y direction via the inter-string-unit insulating layer SHE. Further, each of the conductive layers 110 is connected to the contact CC. Substantially circular columnar insulating members HR for supporting the insulating layers 101 during a manufacturing process are provided near the contact CC. Further, an inter-memory-block insulating layer ST is provided between the memory blocks MB arranged in the Y direction. The plurality of conductive layers 110 are separated from each other in the Y direction via the inter-memory-block insulating layer ST.

Figure 7:
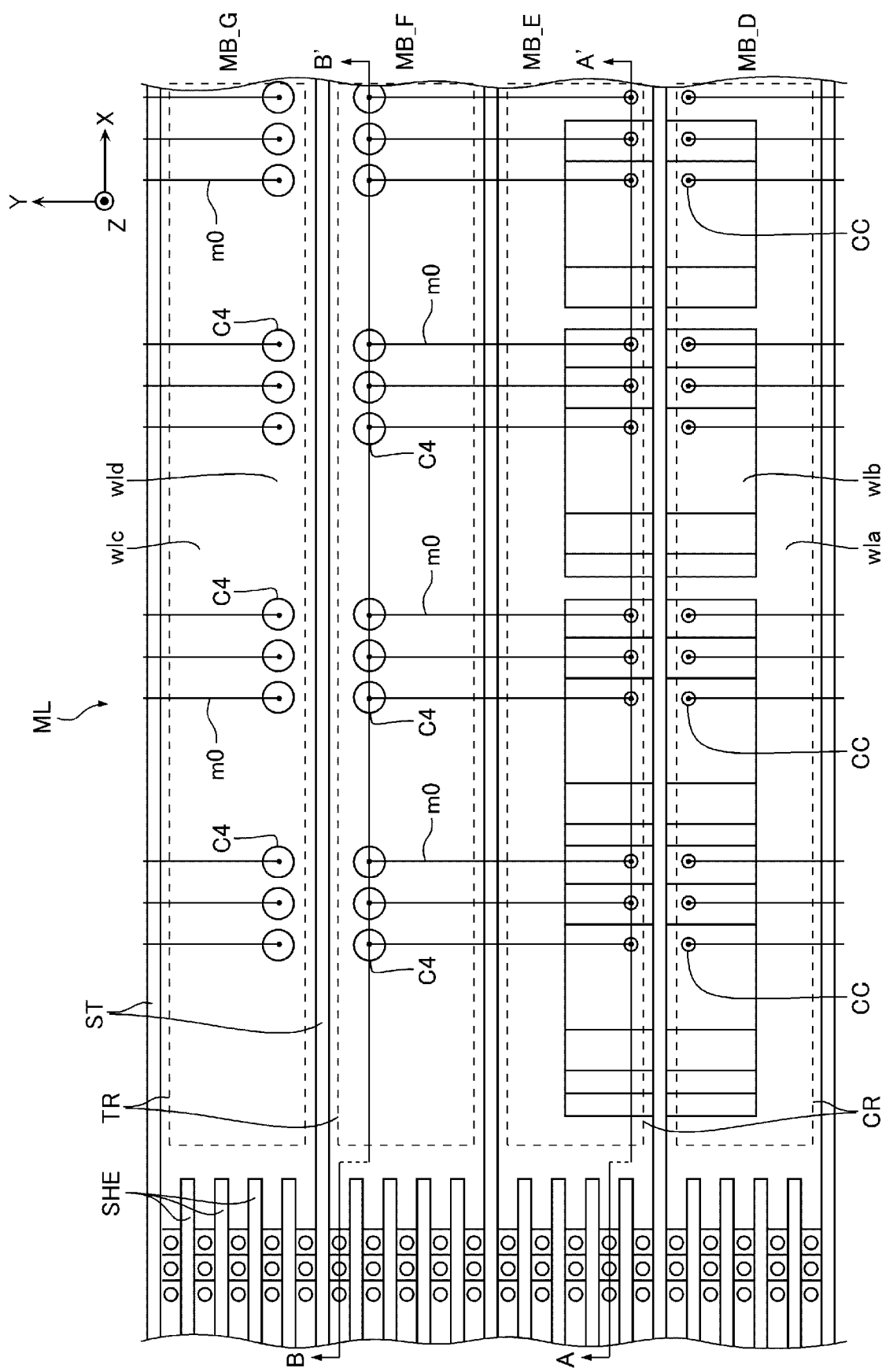
FIG. 7 is a schematic enlarged view of FIG. 5.

FIG. 7 is an enlarged view of a part of FIG. 5 and is a schematic plan view illustrating configurations of the contact region CR and the penetration contact region TR.

The contact region CR includes an interconnection region wla and a contact region wlb that extend in the X direction and arranged in the Y direction. The interconnection region wla includes some of the plurality of conductive layers 110 arranged in the Z direction. A part of the conductive layer 110 extends in the X direction along the inter-memory-block insulating layer ST. The contact CC is not provided in the interconnection region wla. The contact region wlb includes the plurality of contact CCs arranged in the X direction and some of the plurality of conductive layers 110 arranged in the Z direction. A part of the conductive layer 110 includes a connection portion connected to one of the plurality of contacts CC, and an opening for connecting the rest of the contacts CCs to the lower conductive layers 110.

The penetration contact region TR includes an interconnection region wlc and a contact region wld that extend in the X direction and arranged in the Y direction. The interconnection region wlc includes some of the plurality of conductive layers 110 arranged in the Z direction. A part of the conductive layer 110 extends in the X direction along the inter-memory-block insulating layer ST. Penetration contacts C4 are not provided in the interconnection region wlc. The contact region wld includes a plurality of the penetration contacts C4 arranged in the X direction and some of the plurality of conductive layers 110 arranged in the Z direction. A part of the conductive layer 110 includes a plurality of penetration holes provided corresponding to the penetration contacts C4.

As described with reference to FIG. 5, each memory block MB includes the memory region MR provided on one side (for example, right sides in FIGS. 5 and 7) in the X direction and the memory region MR provided on the other side (for example, left sides of FIGS. 5 and 7) in the X direction. Each of the two memory region MRs includes some of the plurality of conductive layers 110 arranged in the Z direction. some of the conductive layers 110 are connected to each other via the interconnection region wla (FIG. 7) and the interconnection region wlc (FIG. 7). Further, the plurality of conductive layers 110 are connected to the plurality of transistors Tr provided on the front surface of the semiconductor substrate S via the plurality of contacts CC, interconnections m0 extending in the Y direction, and the penetration contacts C4.

Figure 8:
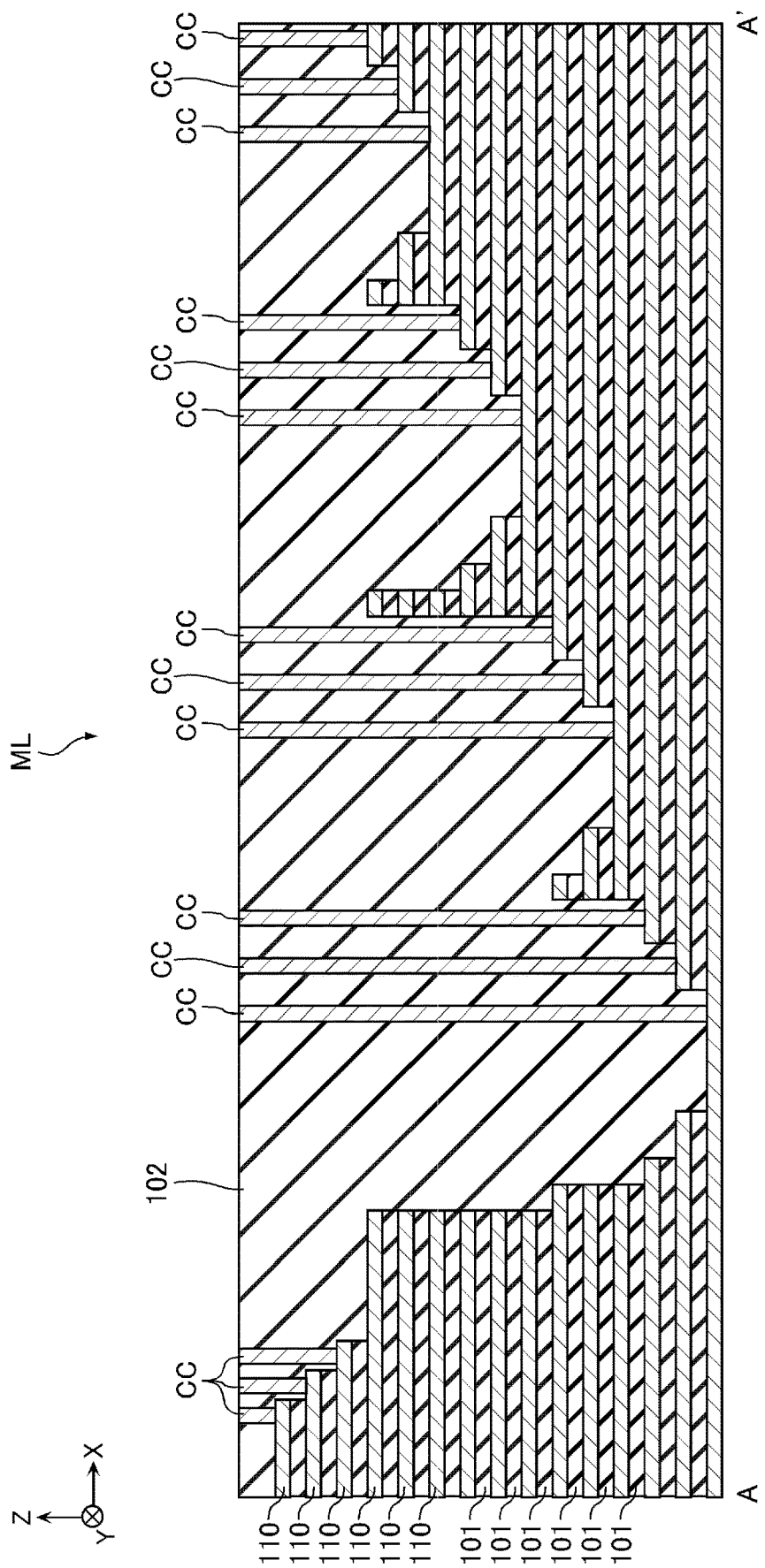
FIG. 8 is a schematic cross-sectional view taken along line A-A' of a structure illustrated in FIG. 7 and viewed in a direction of an arrow thereof.

FIG. 8 is a schematic cross-sectional view of the configuration illustrated in FIG. 7 which is taken along line A-A' and viewed in a direction of an arrow thereof. As illustrated in FIG. 8, the contact CC extends in the Z direction and has a lower end connected to the conductive layer 110. Further, an insulating layer 102 such as silicon oxide ($SiO_2$) is provided between the contacts CC.

Figure 9:
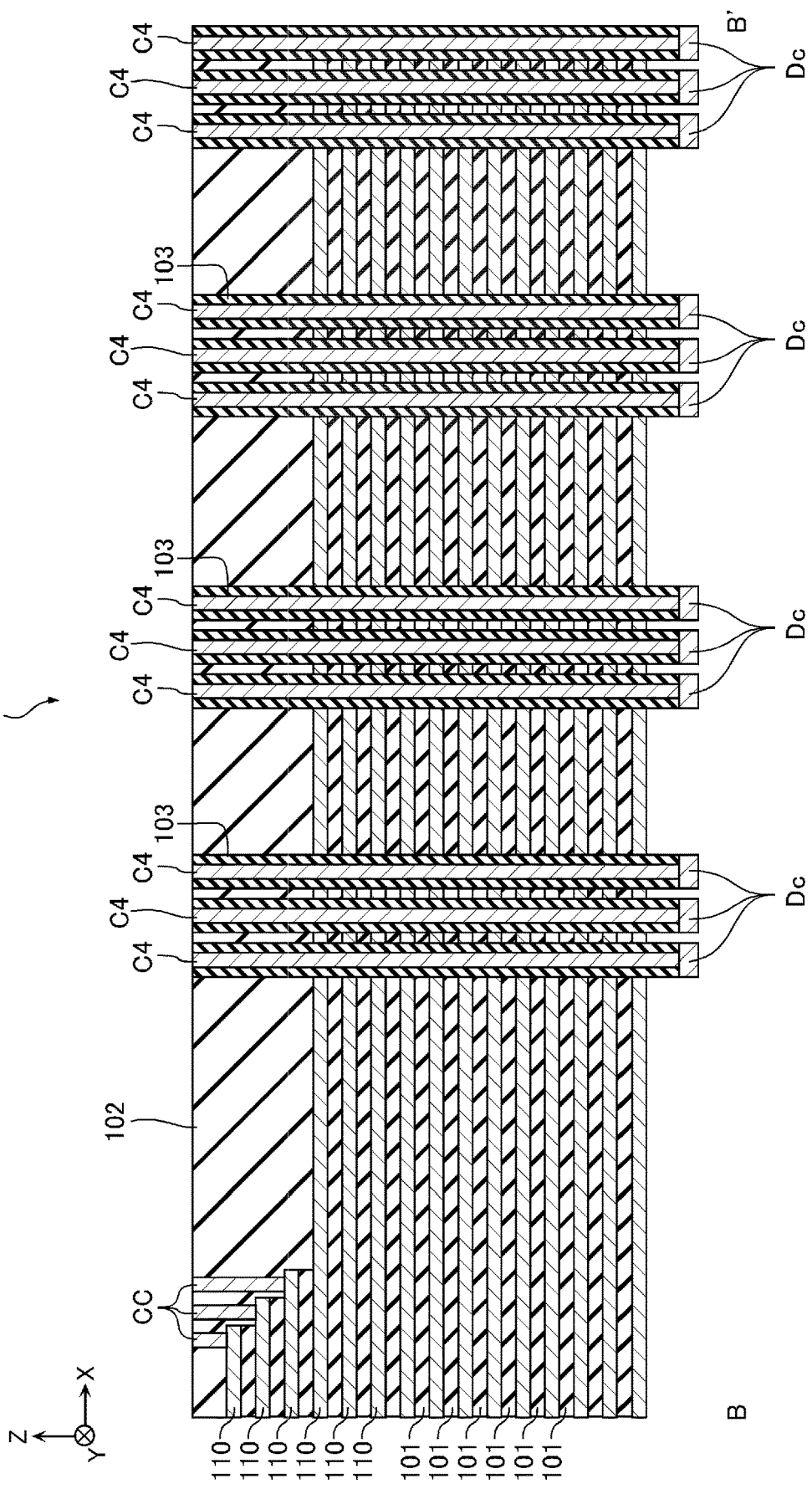
FIG. 9 is a schematic cross-sectional view taken along line B-B' of a structure illustrated in FIG. 7 and viewed in a direction of an arrow thereof.

FIG. 9 is a schematic cross-sectional view of the configuration illustrated in FIG. 7 which is taken along line B-B' and viewed in a direction of an arrow thereof. As illustrated in FIG. 9, each of the penetration contacts C4 extends in the Z direction by penetrating the plurality of conductive layers 110 and the plurality of insulating layers 101 to be connected to the interconnection Dc in the circuit layer CL. Further, each of the penetration contacts C4 is electrically insulated from the conductive layers 110 via insulating layers and the like. For example, in the illustrated example, insulating layers 103 such as silicon oxide ($SiO_2$) that cover outer circumferential surfaces of the penetration contacts C4 are provided between the respective penetration contacts C4 and the respective conductive layers 110, and the penetration contacts C4 are electrically insulated from the conductive layers 110 by the insulating layers 103. The configuration is merely an example, and a specific configuration can be adjusted as appropriate. For example, a plurality of insulating layers such as silicon nitrides (SiN) arranged in the Z direction via the plurality of insulating layers 101 may be provided between the penetration contacts C4 and the conductive layers 110, and each of the penetration contacts C4 may be electrically insulated from the conductive layers 110 by insulating layers such as silicon. In this case, for example, the insulating layers 103 illustrated in FIG. 9 may be provided or omitted.

Circuit Layer CL

Figure 10:
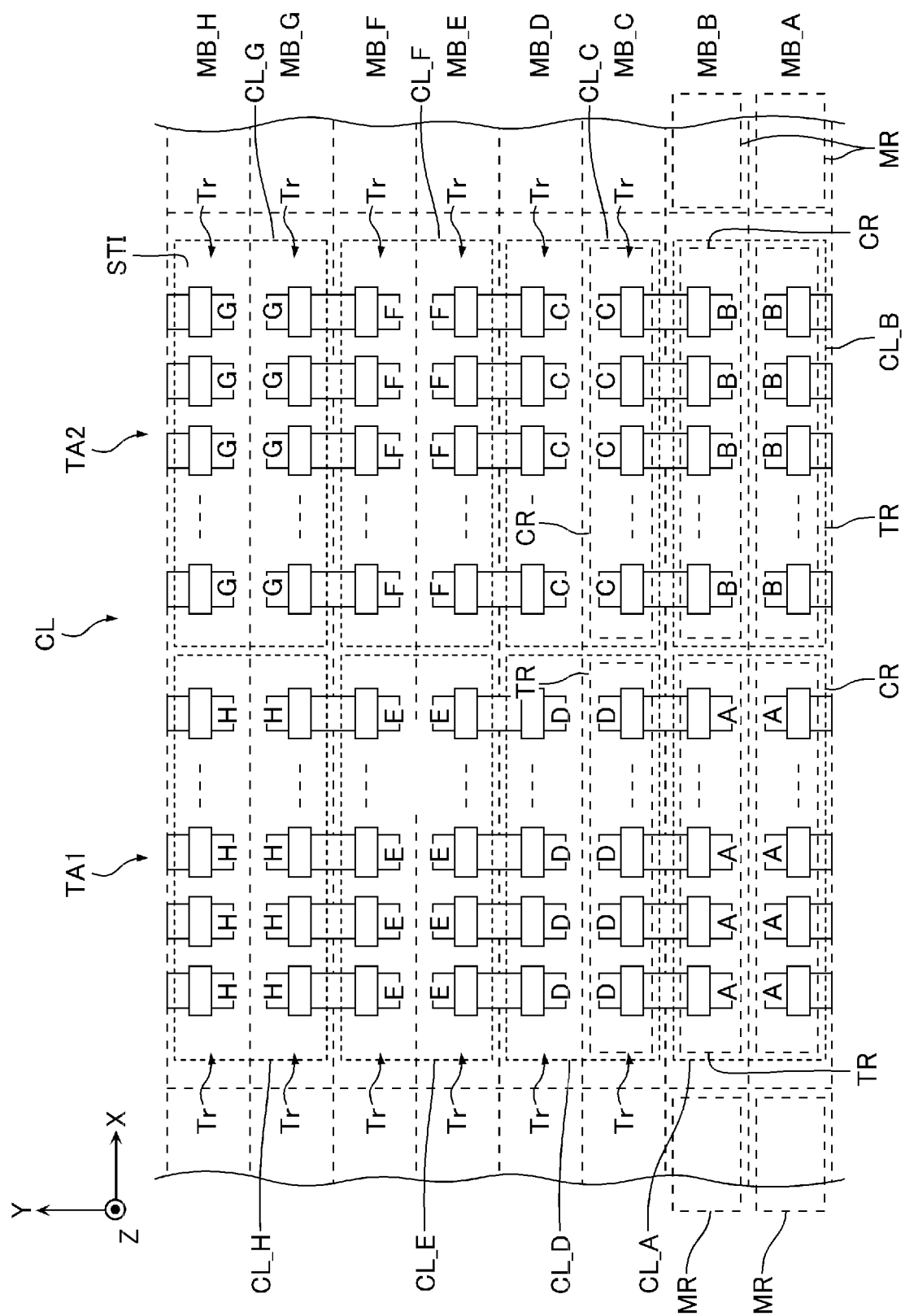
FIG. 10 is a schematic enlarged view of FIG. 4.

FIG. 10 is a schematic plan view illustrating an arrangement of transistor arrays TA1 and TA2 provided in the circuit layer CL located in a lower layer of the memory layer ML of FIG. 5. The transistor arrays TA1 and TA2 are arranged adjacent to each other in the X direction. The transistor arrays TA1 and TA2 each include a plurality of transistors Tr for driving the memory blocks MB_A to MB_H. The circuit layer CL includes circuit regions CL_A to CL_H. The circuit regions CL_A to CL_H are arranged near the contact regions CR and the penetration contact regions TR connected to the memory blocks MB_A to MB_H, respectively. The transistors Tr for driving the memory blocks MB_A to MB_H are arranged in the circuit regions CL_A to CL_H. Signs A to H attached to the respective transistors Tr correspond to signs at the end of the memory blocks MB_A to MB_H, respectively, driven by the transistors Tr. For example, circuit regions CL_A, CL_D, CL_E, and CL_H for driving the memory blocks MB_A, MB_D, MB_E, and MB_H, respectively, are arranged in a region where the transistor array TA1 illustrated on the left side of FIG. 10 is arranged, in the two memory blocks MB adjacent to each other in the Y direction. Further, circuit regions CL_B, CL_C, CL_F, and CL_G for driving the memory blocks MB_B, MB_C, MB_F, and MB_G, respectively, are arranged in a region where the transistor array TA2 illustrated on the right side of FIG. 10 is arranged, in the two memory blocks MB adjacent to each other in the Y direction. The arrangement of the circuit regions CL_A to CL_H is merely an example, and other arrangements may be used.

Figure 11:
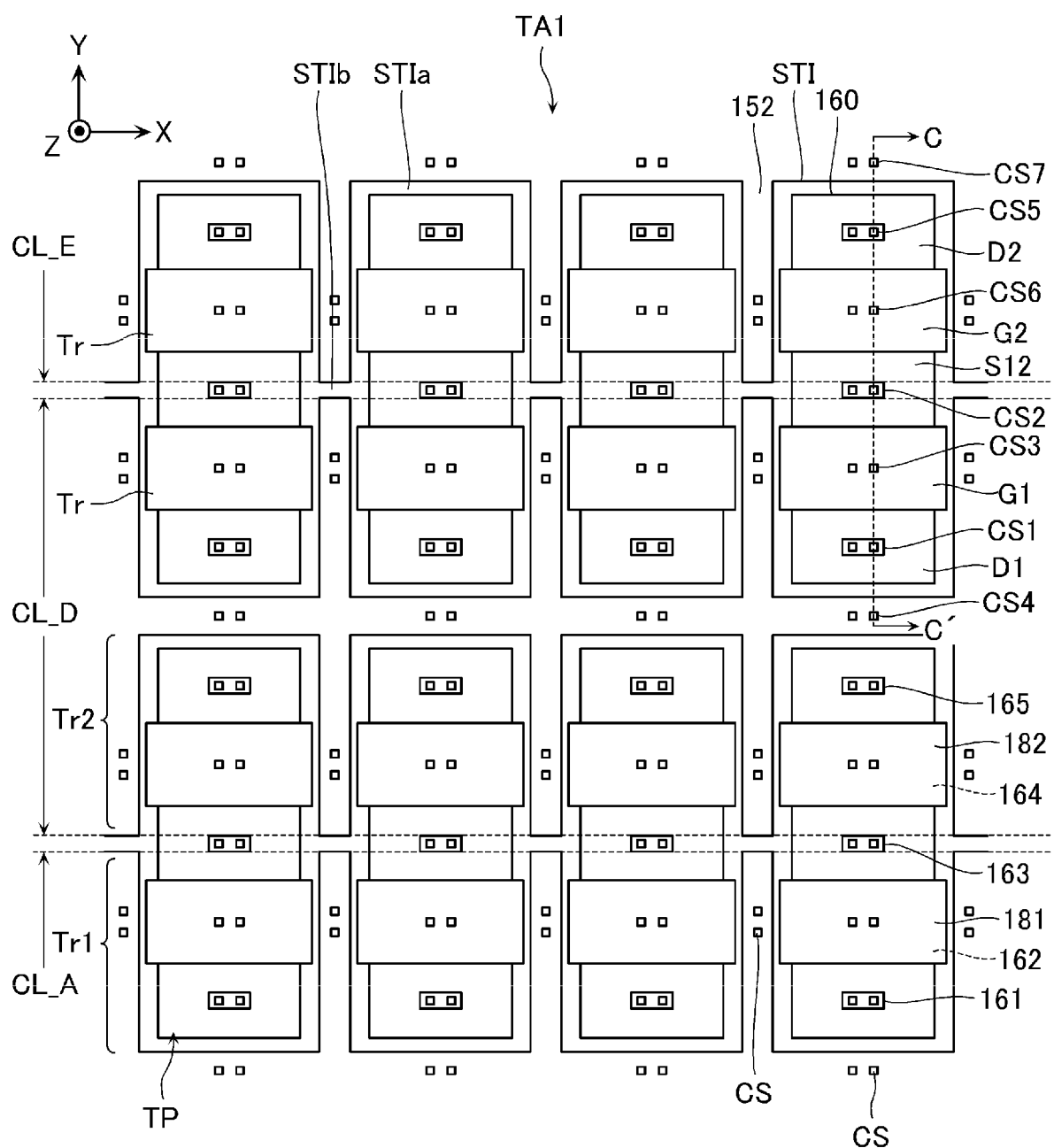
FIG. 11 is a schematic enlarged view of a circuit region corresponding to FIG. 10.

FIG. 11 is an enlarged plan view of a part of the transistor array TA1 of FIG. 10. Since the transistor array TA2 has the same configuration as the transistor array TA1, description thereof is omitted. The transistor array TA1 includes the plurality of transistors Tr arranged in a matrix configuration in the X direction and the Y direction. Each of the plurality of transistors Tr functions as a block drive transistor 35 (FIG. 1). In the illustrated example, an arrangement cycle of the transistors Tr in the Y direction coincides with an arrangement cycle of the memory blocks MB in the Y direction.

The plurality of transistors Tr include first transistors Tr1 and second transistors Tr2. A set of the first transistor Tr1 and the second transistor Tr2 adjacent to each other in the Y direction configures one transistor pair TP. The transistor pairs TP are arranged in the X direction and the Y direction. Each of the transistor pairs TP sequentially has a drain region D1, a gate region G1, a source region S12, a gate region G2, and a drain region D2 in the Y direction. The drain region D1 and the gate region G1 function as a drain and a gate of the first transistor Tr1. The gate region G2 and the drain region D2 function as a gate and a drain of the second transistor Tr2. The source region S12 functions as a common source for the first transistor Tr1 and the second transistor Tr2. The first transistors Tr1 and the second transistors Tr2, adjacent to each other, of two transistor pairs TP adjacent to each other in the Y direction drive the same memory block MB. For example, the upper and lower transistors Tr arranged in the circuit region CL_D illustrated in FIG. 11 function as the block drive transistors 35 (FIG. 1) that drive the memory block MB_D.

Figure 12:
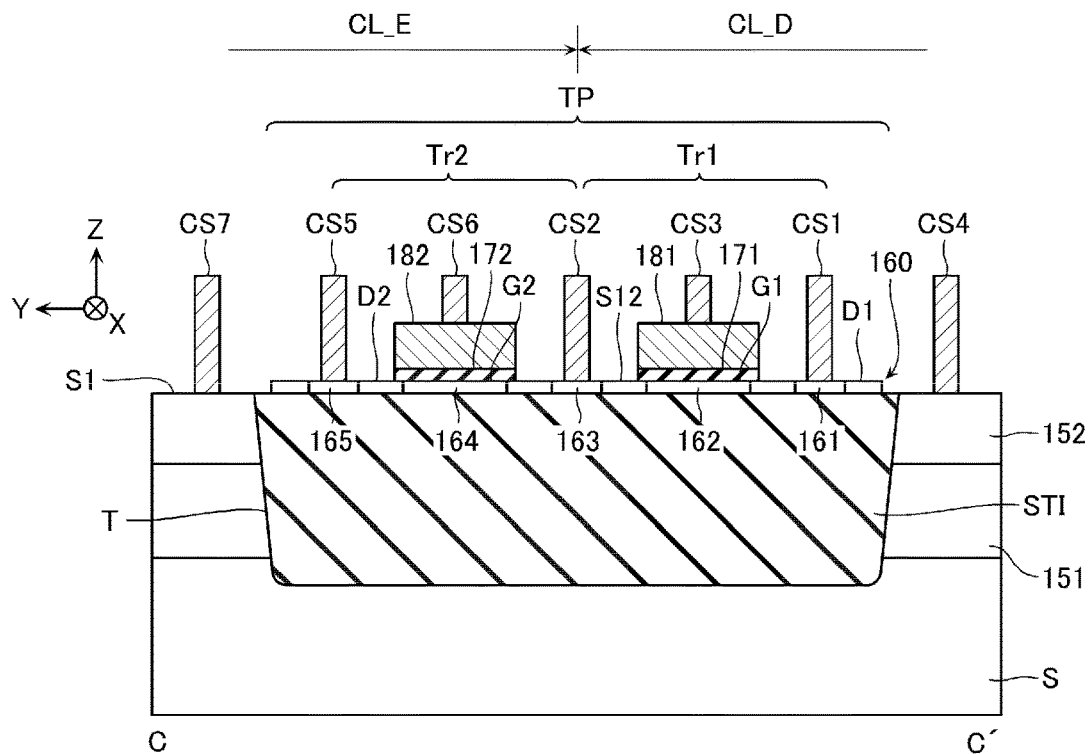
FIG. 12 is a schematic cross-sectional view taken along line C-C' of a structure illustrated in FIG. 11 and viewed in a direction of an arrow thereof.

FIG. 12 is a schematic cross-sectional view of one transistor pair TP illustrated in FIG. 11 which is taken along line C-C' and viewed in a direction of an arrow thereof. For example, the insulating layer STI buried in a groove T formed toward the inside of the semiconductor substrate S from a main surface S1 of the semiconductor substrate S is formed in the semiconductor substrate S made of single crystal silicon (Si) and the like. The insulating layer STI is made of, for example, silicon oxide ($S_iO_2$) and the like. As illustrated in FIG. 11, for example, the insulating layer STI includes a plurality of insulating regions STIa arranged in the X direction and the Y direction in correspondence with the transistor pairs TP. The insulating regions STIa are each formed in a substantially rectangular shape. Further, the insulating layer STI includes a plurality of insulating regions STIb arranged in the X direction and the Y direction. The insulating regions STIb are each provided between two insulating regions STIa adjacent to each other in the X direction and are each connected to central portions of the two insulating regions STIa in the Y direction. Widths of the insulating region STIb in the X direction and the Y direction are smaller than widths of the insulating region STIa in the X direction and the Y direction, respectively. An N-type well 151 that surrounds the insulating layer STI from the main surface S1 to a predetermined depth is formed in the semiconductor substrate S. Further, an impurity layer 152 doped with N-type impurity of a high concentration is formed on the N-type well 151 on the main surface S1 side of the semiconductor substrate S.

One semiconductor layer 160 is formed on each of the insulating regions STIa of the insulating layer STI. As illustrated in FIG. 11, the semiconductor layer 160 is formed within a region of an upper surface of one insulating region STIa, thereby being insulated from the semiconductor substrate S. The semiconductor layer 160 is made of, for example, polycrystalline silicon or single crystal silicon. The semiconductor layer 160 sequentially has a drain region D1, a gate region G1, a source region S12, a gate region G2, and a drain region D2 in the Y direction. The semiconductor layer 160 has impurity layers 162 and 164 including P-type impurity of a low concentration in a channel portion and another body portion corresponding to the gate regions G1 and G2. The semiconductor layer 160 has an impurity layer including N-type impurity of a low concentration in the drain regions D1 and D2 and the source region S12 and has impurity layers 161, 163, and 165 doped with N-type impurity of a high concentration in contact regions of the impurity layers. Gate insulation layers 171 and 172 are formed on the gate regions G1 and G2, respectively, of the semiconductor layer 160. The gate insulation layers 171 and 172 are made of, for example, silicon oxide (SiO2) and the like. Gate electrodes 181 and 182 are formed on the gate insulation layers 171 and 172, respectively. The gate electrodes 181 and 182 are each formed of a conductive layer made of polycrystalline silicon (Si) and the like.

The contacts CS1, CS2, and CS3 are connected to the impurity layer 161 of the drain region D1 configuring the first transistor Tr1, the impurity layer 163 of the source region S12, and the gate electrode 181, respectively. The contacts CS5 and CS6 are connected to the impurity layer 165 of the drain region D2 configuring the second transistor Tr2 and the gate electrode 182, respectively. In the impurity layer 152 of the semiconductor substrate S located between the insulating layers STI adjacent in the Y direction, the contact CS4 is connected to the first transistor Tr1 side, and the contact CS7 is connected to the second transistor Tr2 side. In addition to this, the contact CS to the semiconductor substrate S is also provided on both sides of the gate regions G1 and G2 of each transistor pair TP in the Y direction, for example, as illustrated in FIG. 11.

The contact CS1 is connected to the word line WL of the corresponding memory block MB_D, and the contact CS5 is connected to the word line WL of the corresponding memory block MB_E. The contact CS2 is connected to the interconnection CG. The contacts CS3 and CS6 are connected to the corresponding block selection line BLKSEL.

Write Operation

Next, a write operation of data to the selected memory block MB in the semiconductor device configured with this way will be described.

Figure 13:
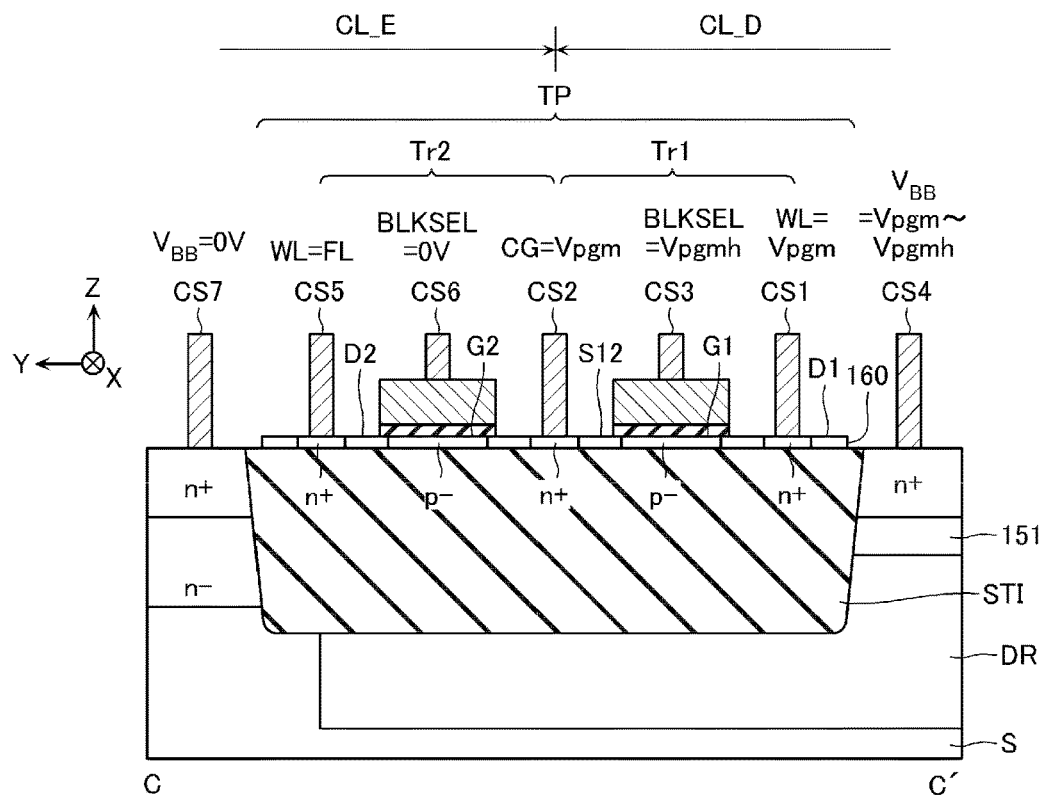
FIG. 13 is a schematic cross-sectional view taken along line C-C' of a structure illustrated in FIG. 11 and viewed in a direction of an arrow thereof.

FIG. 13 illustrates voltages applied to the respective units when the first transistor Tr1 for driving the memory block MB_D is set to a block selection state, and when the second transistor Tr2 for driving the memory block MB_E is set to a block non-selection state. At this time, a program voltage Vpgm is applied to the contact CS2 via the interconnection CG. A voltage Vpgmh (>Vpgm) is applied to the contact CS3 via the block selection line BLKSEL. A voltage Vss (=0 V) is applied to the contact CS6 via the block selection line BLKSEL. thereby, the first transistor Tr1 becomes an on-state, and the program voltage Vpgm applied to the interconnection CG is transmitted to the contact CS1 via a channel formed in the gate region G1. As a result, the program voltage Vpgm is applied to the word line WL of the selected memory block MB_D. Meanwhile, the second transistor Tr2 becomes an off-state. Thereby, the word line WL of the non-selected memory block MB_E becomes a floating state.

During the write operation described above, the voltages Vpgm to Vpgmh are applied to the contact CS4 connected to the semiconductor substrate S on the first transistor Tr1 side that drives the selected memory block MB_D as a substrate voltage $V_{BB}$. Further, the voltages Vpgm to Vpgmh are also applied to the contacts CS on both sides, in the X direction, of the gate region G1 of the first transistor Tr1 that drives the selected memory block MB_D. Thereby, a depletion layer DR is formed at a bottom of the insulating layer STI corresponding to the first transistor Tr1. Further, a voltage Vss (0 V) is applied to the contact CS7 connected to the semiconductor substrate S on the second transistor Tr2 side as a substrate voltage $V_{BB}$. In order to apply the above-described voltages, the contact CS3 and the contact CS4 may be electrically connected to each other, and the contact CS6 and the contact CS7 may be electrically connected to each other. Further, substantially the same voltage may be individually applied to the contacts CS.

Voltage application patterns of the first transistor Tr1 that drives the selected memory block MB_D and other transistor pairs TP adjacent to each other in the Y direction are the same as each other except that the voltage application pattern of the transistor pairs TP described above is inverted in the Y direction, and thus, detailed descriptions thereof are omitted.

Effects of First Embodiment

A general transistor Tr of the related art is formed based on a double-well structure or a triple-well structure formed in the semiconductor substrate S and has a structure in which adjacent transistors Tr are separated by the insulating layer STI. However, when the transistors are integrated according to high stack and high integration of a semiconductor device, a leakage current from the adjacent transistor increases. This makes it difficult to reduce a pitch between elements and leads to an increase in a ratio of the transistor to a chip area. Particularly, this tendency is remarkably high in withstand voltage transistors such as memory block select transistors of a semiconductor storage device.

According to the first embodiment, the transistors Tr are formed on the insulating layer STI and are insulated from the semiconductor substrate S, a problem of leakage between adjacent transistors Tr does not occur, and a pitch between the elements can be reduced. Further, by arranging the insulating layer STI under the semiconductor layer 160, the semiconductor layer 160 and the semiconductor substrate S are separated from each other, and thus, back bias characteristics are improved.

Further, in at least one embodiment, the high voltages Vpgm to Vpgmh are applied to the N-type well 151 via the contact CS4 and the N-type impurity layer 152 of a high concentration during the write operation. Thereby, the depletion layer DR is formed at the bottom of the insulating layer STI. As a result, it is possible to prevent an inversion layer from being formed at the bottom of the insulating layer STI directly under the gate electrode 181 to which the program voltage Vpgm is applied. As a result, capacitance between the gate electrode 181 and the bottom of the insulating layer STI is reduced, and a high-speed operation can be performed. In at least one embodiment, the impurity layers 152 are separated from each other in each memory block MB by the insulating layer STI as illustrated in FIG. 11, and thus, the program voltage Vpgm may be applied only to the selected circuit region CL_D.

Further, in a structure of the related art in which a transistor for driving a word line is formed inside the semiconductor substrate S, a triple well structure is required to supply a negative voltage to the word line WL, but in at least one embodiment, the triple well structure is required because the semiconductor layer 160 is insulated and separated from the semiconductor substrate S. Accordingly, a manufacturing process is simplified and a problem of latch-up does not occur.

Second Embodiment

Figure 14:
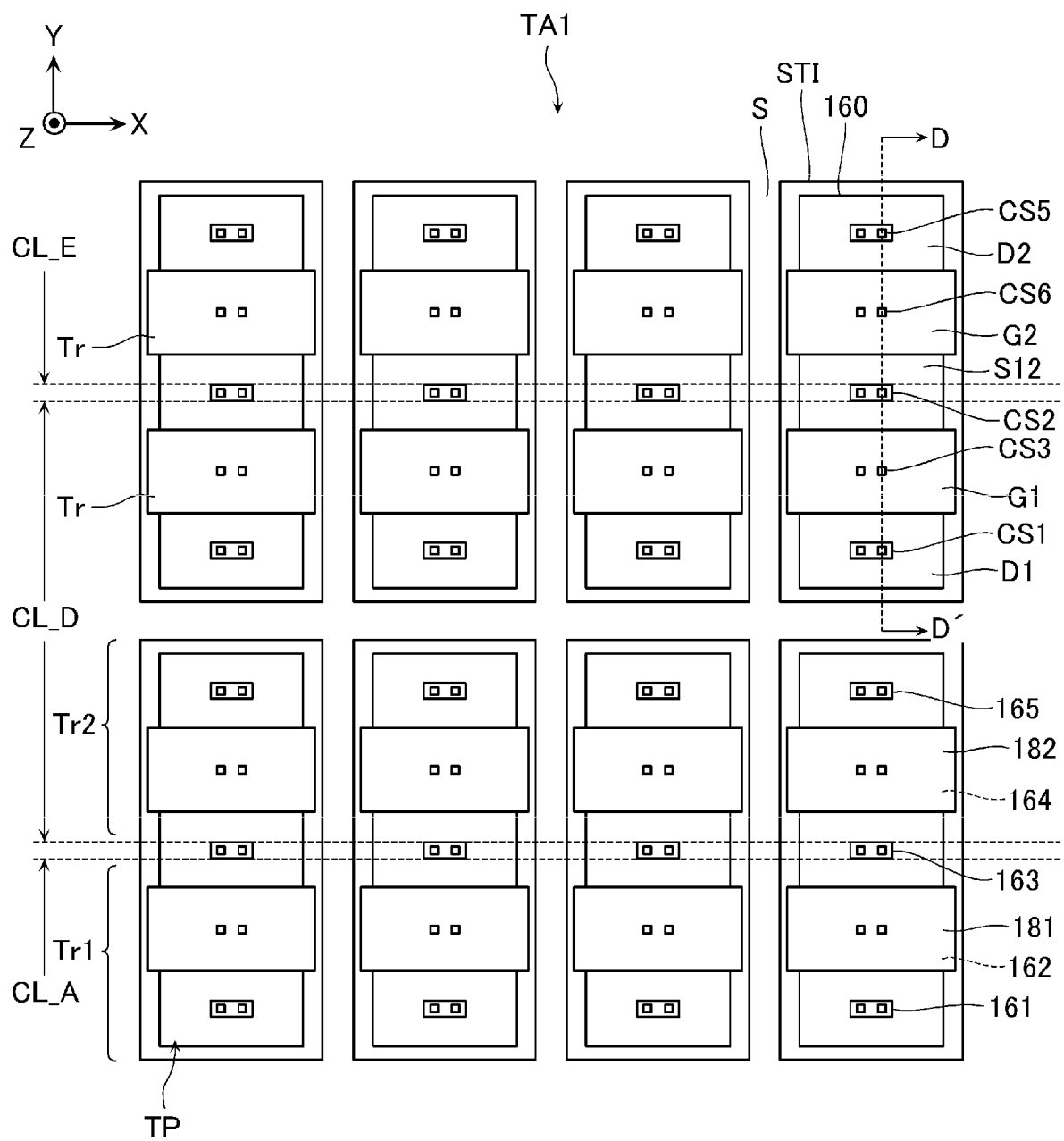
FIG. 14 is a schematic enlarged view of a circuit region of a semiconductor device according to a second embodiment.
Figure 15:
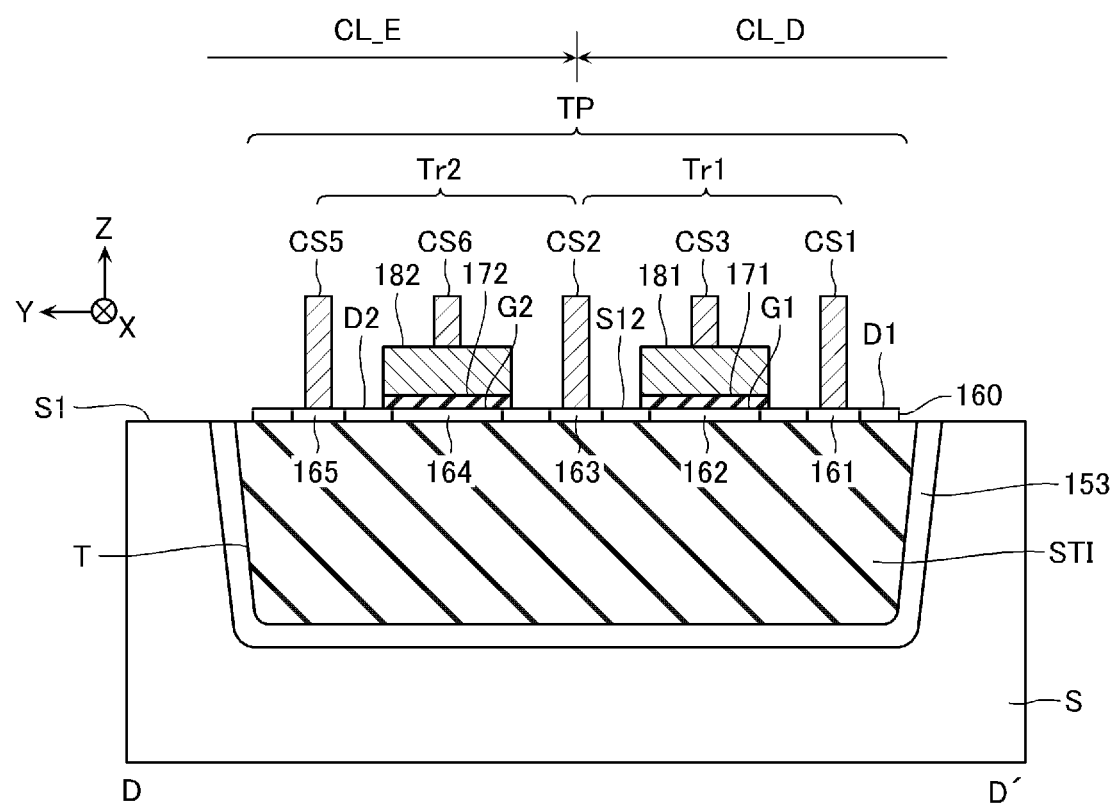
FIG. 15 is a schematic cross-sectional view taken along line D-D' of a structure illustrated in FIG. 14 and viewed in a direction of an arrow thereof.

FIG. 14 is an enlarged plan view of apart of the transistor array TA1 according to a second embodiment. FIG. 15 is a schematic cross-sectional view of one transistor pair TP illustrated in FIG. 14 which is taken along line D-D' and viewed in a direction of an arrow thereof. In the second embodiment, the same portions as in the first embodiment are denoted by the same reference numerals, and descriptions of redundant portions are omitted.

In the second embodiment, as illustrated in FIG. 15, an impurity layer 153 doped with P-type impurity of a high concentration is formed in a bonding region to the insulating layer STI of the P-type semiconductor substrate S. Further, in the second embodiment, the N-type well is not provided on a front surface of the semiconductor substrate S, and thus, a contact CS for applying a high voltage to the N-type well is not provided.

Effect of Second Embodiment

According to the second embodiment, in addition to the effect of the first embodiment, the P-type impurity layer 153 of a high concentration is formed on a bottom surface of the insulating layer STI, and thus, even when the high voltage Vpgmh is applied to gate electrodes 181 and 182 of the transistors Tr, it is difficult for an inversion layer to be formed near the bottom of the insulating layer STI. Accordingly, unlike the first embodiment, it is not necessary to apply the high voltages Vpgm to Vpgmh to a front surface of the semiconductor substrate S, and a contact CS therefor can be omitted. As a result, a circuit can be further integrated.

Third Embodiment

Figure 16:
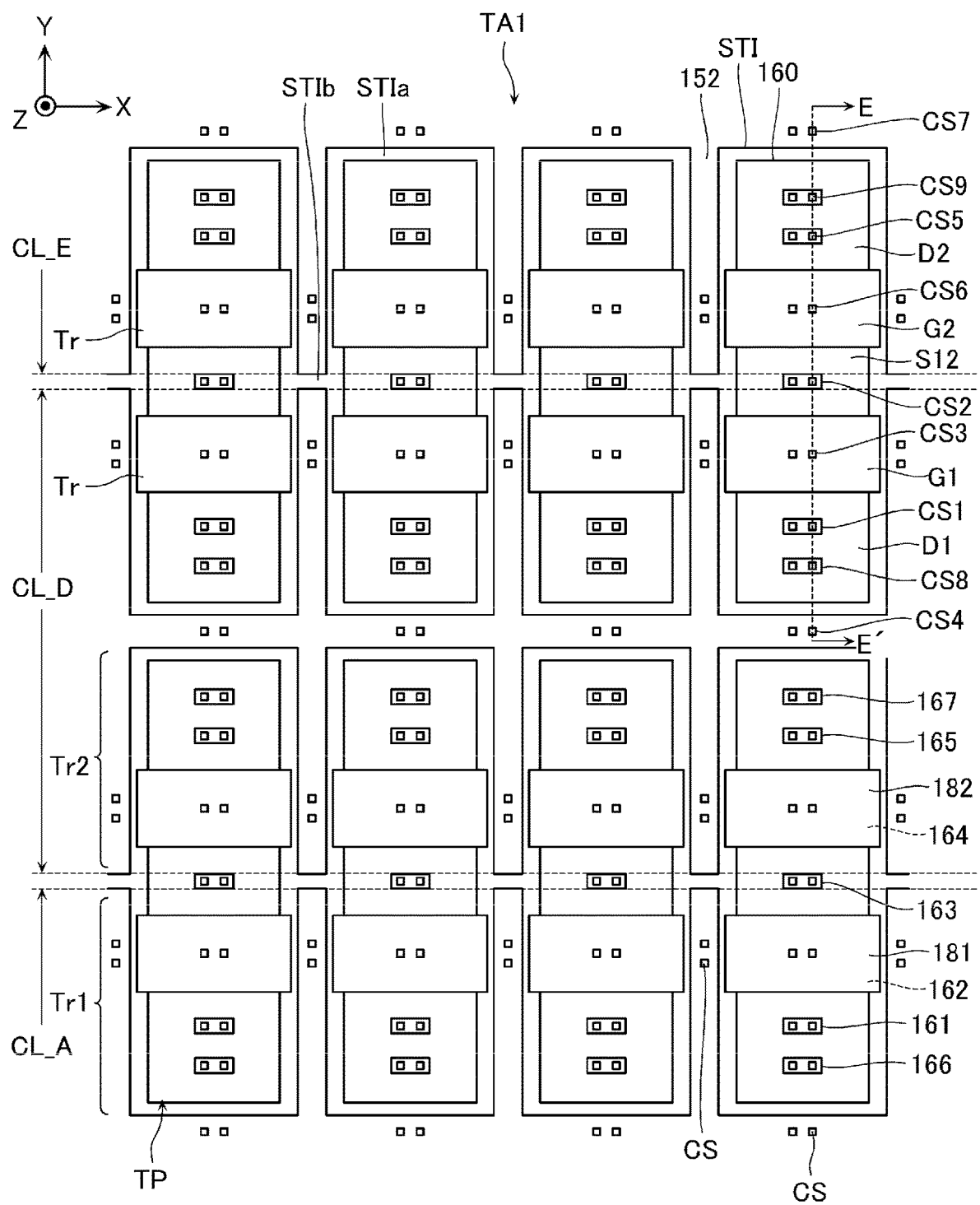
FIG. 16 is a schematic enlarged view of a circuit region of a semiconductor device according to a third embodiment.
Figure 17:
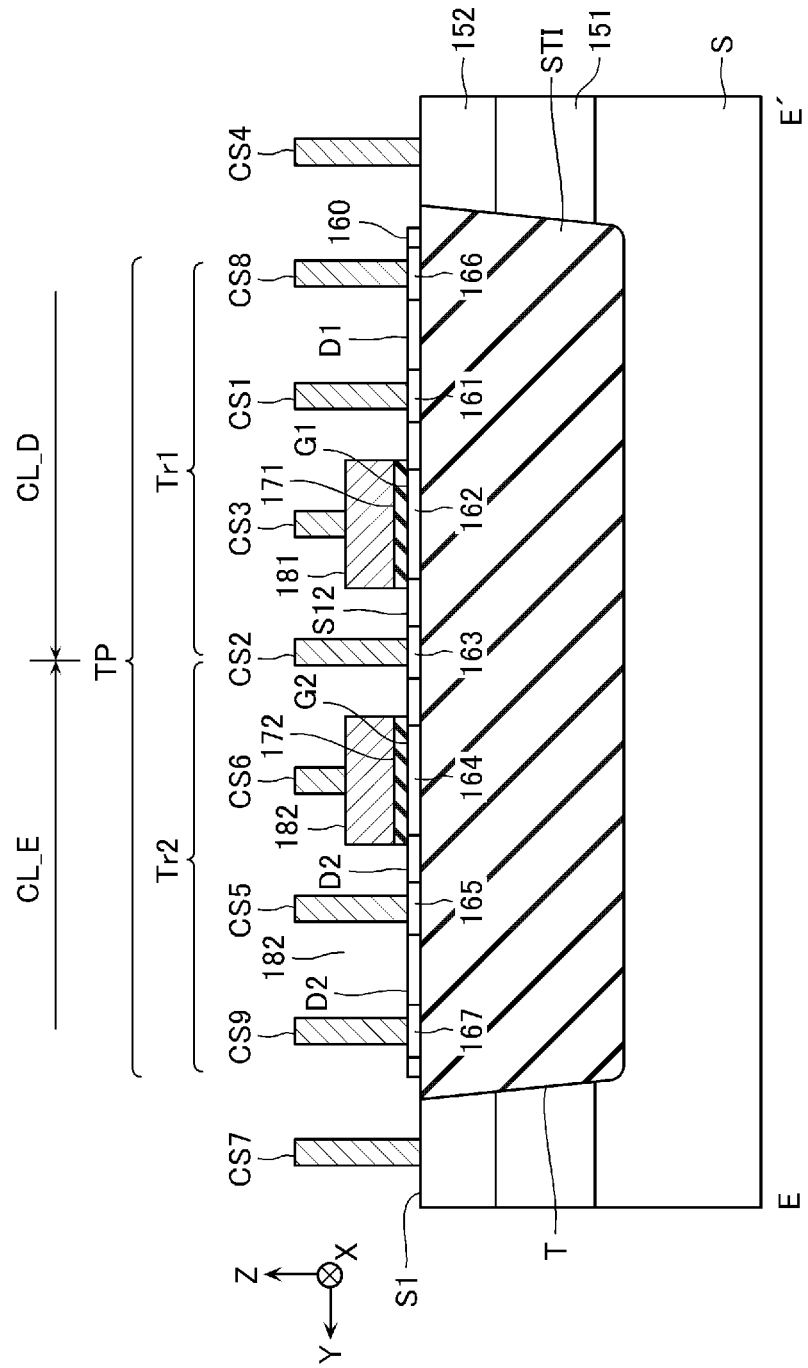
FIG. 17 is a schematic cross-sectional view taken along line E-E' of a structure illustrated in FIG. 16 and viewed in a direction of an arrow thereof.

FIG. 16 is an enlarged plan view of apart of the transistor array TA1 according to a third embodiment. FIG. 17 is a schematic cross-sectional view of one transistor pair TP illustrated in FIG. 16 which is taken along line E-E' and viewed in a direction of an arrow thereof. In the third embodiment, the same portions as in the first embodiment are denoted by the same reference numerals, and descriptions of redundant portions are omitted.

In the third embodiment, in addition to the first embodiment, in order to apply a voltage to a body of the semiconductor layer 160, both ends of the semiconductor layer 160 in the Y direction have impurity layers 166 and 167 doped with N-type impurity of a high concentration. Contacts CS8 and CS9 are connected to the impurity layer 166 and 167, respectively. For example, the voltage Vss (0 V) is applied to the contacts CS8 and CS9.

Effect of Third Embodiment

According to the third embodiment, in addition to the effect of the first embodiment, a bias voltage is applied to a body of the semiconductor layer 160, and thus, back bias characteristics can be further improved and an operation of the transistor Tr can be stabilized.

Fourth Embodiment

Figure 18:
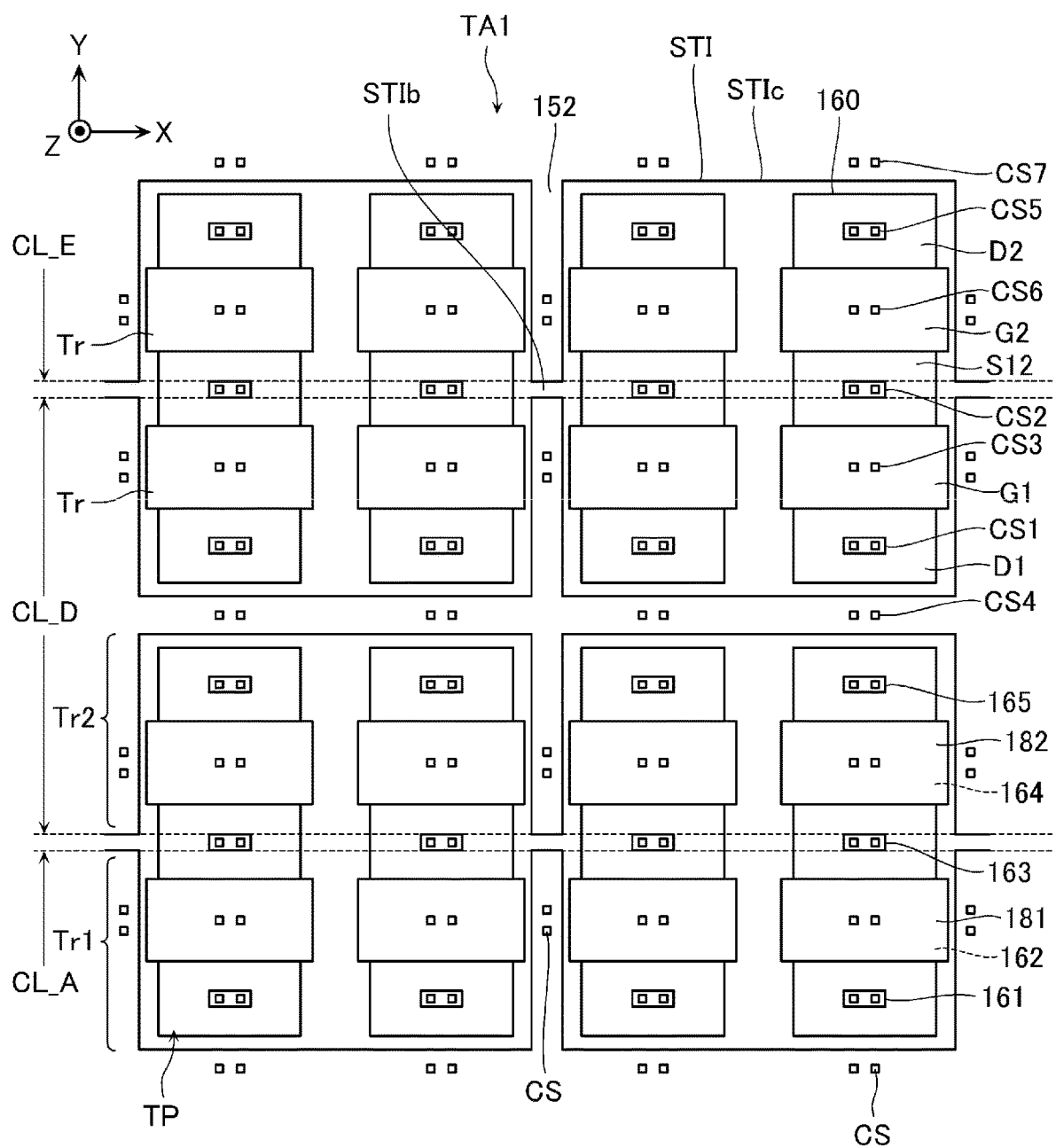
FIG. 18 is a schematic enlarged view of a circuit region of a semiconductor device according to a fourth embodiment.

FIG. 18 is an enlarged plan view of a part of the transistor array TA1 according to a fourth embodiment. In the fourth embodiment, the same portions as in the first embodiment are denoted by the same reference numerals, and descriptions of redundant portions are omitted.

An insulating layer STI according to the fourth embodiment includes a plurality of insulating regions STIc arranged in the X direction and the Y direction in correspondence with two transistor pairs TP adjacent to each other in the X direction. The insulating regions STIc are each formed in a substantially rectangular shape. Two semiconductor layers 160 adjacent to each other in the X direction are formed on each of the insulating regions STIc. The two semiconductor layers 160 are formed within a region of an upper surface of one insulating region STIc, and are thereby insulated from the semiconductor substrate S.

Fifth Embodiment

Figure 19:
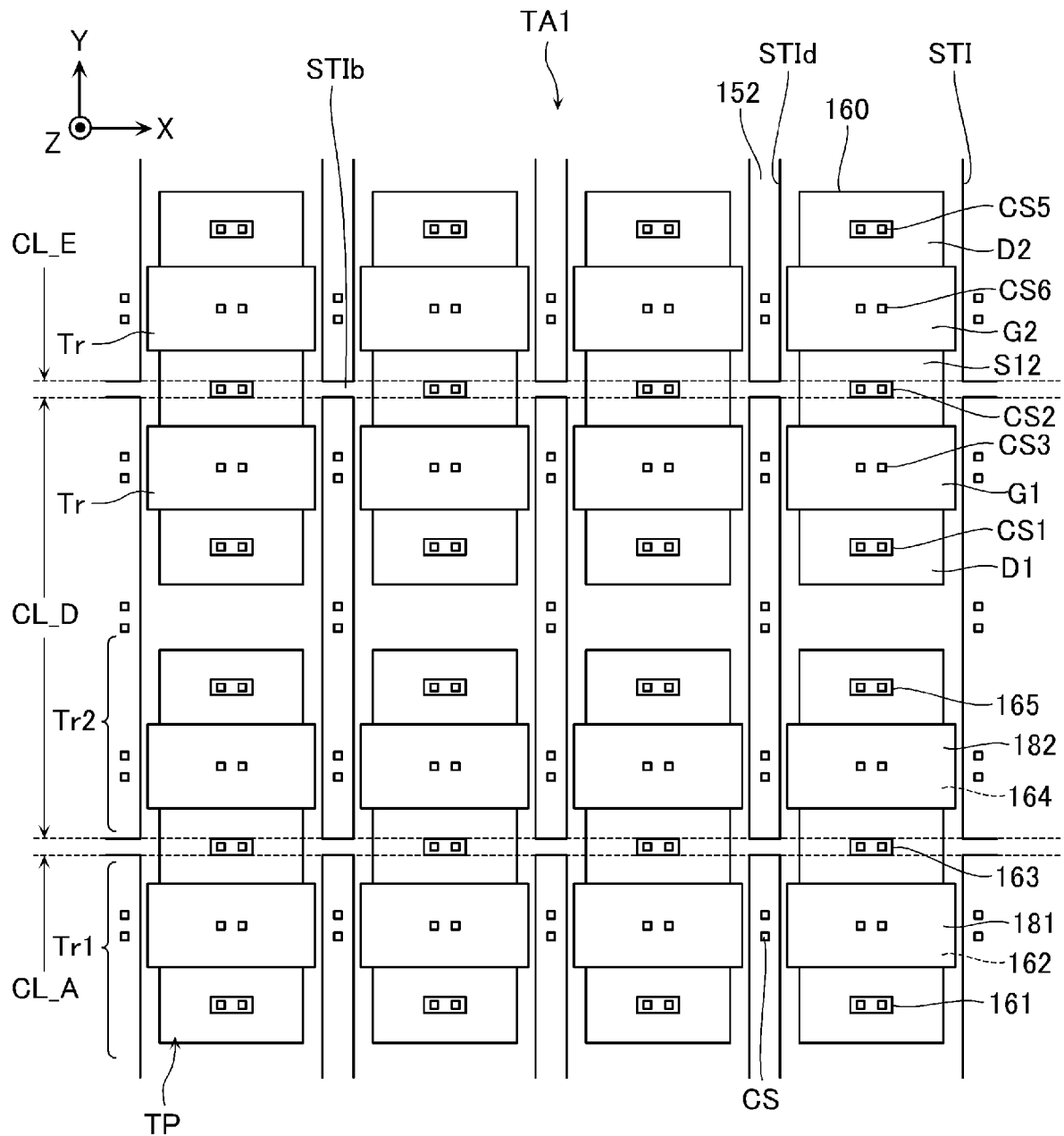
FIG. 19 is a schematic enlarged view of a circuit region of a semiconductor device according to a fifth embodiment.

FIG. 19 is an enlarged plan view of a part of the transistor array TA1 according to a fifth embodiment. In the fifth embodiment, the same portions as in the first embodiment are denoted by the same reference numerals, and descriptions of redundant portions are omitted.

An insulating layer STI according to the fourth embodiment includes a plurality of insulating regions STId that extend in the Y direction in correspondence with a plurality of transistor pairs TP arranged in the Y direction and that are arranged in the X direction. A plurality of semiconductor layers 160 arranged in the Y direction are formed on each of the insulating regions STId. The plurality of semiconductor layers 160 are formed within a region of an upper surface of one insulating region STId, thereby being insulated from the semiconductor substrate S.

Effects of Fourth and Fifth Embodiments

By providing a plurality of transistor pairs TP on common insulating regions STIc and STId as in the fourth embodiment and the fifth embodiment, it is possible to further reduce an arrangement pitch of the transistor pair TP on the insulating regions STIc and STId and to achieve higher integration.

The insulating layer STI is manufactured, for example, as follows. A groove T is formed in the semiconductor substrate S. The insulating layer STI is buried in the groove T. A front surface of the insulating layer STI is planarized by, for example, chemical mechanical polishing (CMP). At this time, when an area of the insulating layer STI is much larger than an area of the front surface of the semiconductor substrate S, dishing occurs. Accordingly, the insulating layer STI in which the plurality of transistor pairs TPs are arranged may be set to be used in common as appropriate within a range in which the area of the front surface of the insulating layer STI does not exceed a predetermined upper limit value for the area of the front surface of the semiconductor substrate S.

Other

Although the first to fifth embodiments are described above, the embodiments are presented as examples and are not intended to limit the scope of the disclosure. The novel embodiments can be implemented in various other embodiments, and various omissions, replacements, and changes can be made without departing from the idea of the disclosure. For example, in each of the above-described embodiments, the number of transistors Tr formed in one semiconductor layer 160 is two, but for example, four transistors Tr may be formed in one cross-shaped semiconductor layer. Further, in each of the above-described embodiments, an N-channel type high withstand voltage transistor for driving a semiconductor storage device is given as an example, but each of the above-described embodiments may also be applied to a P-channel type high withstand voltage transistor by reversing a polarity thereof. Further, each of the above-described embodiments may also be applied to a low voltage P-type or N-type transistor. Further, each of the above-described embodiments may also be applied to a semiconductor device other than the semiconductor storage device. The embodiments and modifications thereof are included in the scope and idea of the disclosure and are also included in the scope of the disclosure described in the claims and the equivalent scope thereof.

While certain embodiments have been described, these embodiments have been presented byway of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a semiconductor substrate having a main surface;
   a first insulating layer disposed in a groove extending in a direction perpendicular to the main surface of the semiconductor substrate;
   a plurality of transistor pairs that are formed on the first insulating layer, arranged in a first direction along the main surface of the semiconductor substrate, and arranged in a second direction intersecting the first direction, wherein
   each of the plurality of transistor pairs has (i) a first semiconductor layer formed on the first insulating layer and including a first region, a second region, a third region, a fourth region, and a fifth region sequentially arranged in the first direction, (ii) second insulating layers respectively disposed on the second region and the fourth region of the first semiconductor layer, and (iii) first conductive layers respectively disposed on the second insulating layers, a first contact is connected to the first region, a second contact is connected to the third region, a third contact is connected to the first conductive layer on the second region, a fifth contact is connected to the fifth region of the first semiconductor layer, a sixth contact is connected to the first conductive layer on the fourth region, and portions corresponding to the first region to the third region are configured to provide a first transistor, and portions corresponding to the third region to the fifth region are configured to provide a second transistor; and a memory cell array including a plurality of memory blocks electrically connected to the first transistor and the second transistor, wherein the plurality of transistor pairs includes a first transistor pair, a second transistor pair adjacent to the first transistor pair in the first direction, a third transistor pair adjacent to the first transistor pair in the second direction, and a fourth transistor pair adjacent to the second transistor pair in the second direction and adjacent to the third transistor pair in the first direction, and the first transistor of the first transistor pair arranged on a side of the second transistor pair, the second transistor of the second transistor pair arranged on a side of the first transistor pair, the first transistor of the third transistor pair arranged on a side of the fourth transistor pair, and the second transistor of the fourth transistor pair arranged on a side of the third transistor pair are electrically connected to the same memory block of the memory cell array.

2. The semiconductor device according to claim 1, wherein the first insulating layer includes four first insulating regions arranged in the first direction and the second direction in correspondence with the first to fourth transistor pairs, respectively, and two second insulating regions respectively disposed between the two first insulating regions adjacent to each other in the second direction and connected to the two first insulating regions.

3. The semiconductor device according to claim 1, wherein the first insulating layer includes a plurality of first insulating regions arranged in the first direction and the second direction in correspondence with the plurality of transistor pairs, respectively, and includes a plurality of second insulating regions respectively disposed between the two first insulating regions adjacent to each other in the second direction and connected to the two first insulating regions, the main surface of the semiconductor substrate includes a sixth region surrounded by the plurality of first insulating regions and the plurality of second insulating regions, and the first transistor and the second transistor electrically connected to a same memory block are arranged in the first direction via the sixth region.

4. The semiconductor device according to claim 3, wherein a fourth contact is connected to the sixth region of the semiconductor substrate, and wherein the semiconductor device is configured to apply a voltage at least as high as a voltage applied to the second contact to the fourth contact at a time of a write operation to the same memory block.

5. The semiconductor device according to claim 1, wherein the first insulating layer includes a third insulating region provided corresponding to the first and third transistor pairs, and a fourth insulating region disposed corresponding to the second and fourth transistor pairs.

6. The semiconductor device according to claim 1, wherein the first insulating layer includes:

a fifth insulating region provided corresponding to the first and second transistor pairs, and a sixth insulating region provided corresponding to the third and fourth transistor pairs.

7. The semiconductor device according to claim 1, including a peripheral circuit.

8. The semiconductor device according to claim 1, wherein the semiconductor substrate includes silicon.

9. The semiconductor device according to claim 1, wherein the first region, second region and third region correspond respectively to one of a source or a drain, a gate, and an other of the source or drain.

10. The semiconductor device according to claim 9, wherein the fourth region corresponds to another gate.

* * * * *